United States Patent
Fujikura et al.

(10) Patent No.: US 8,786,052 B2
(45) Date of Patent: Jul. 22, 2014

(54) NITRIDE SEMICONDUCTOR CRYSTAL PRODUCING METHOD, NITRIDE SEMICONDUCTOR EPITAXIAL WAFER, AND NITRIDE SEMICONDUCTOR FREESTANDING SUBSTRATE

(75) Inventors: Hajime Fujikura, Mito (JP); Taichiroo Konno, Hitachi (JP); Yuichi Oshima, Tsuchiura (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 13/610,496

(22) Filed: Sep. 11, 2012

(65) Prior Publication Data

US 2013/0069075 A1    Mar. 21, 2013

(30) Foreign Application Priority Data

Sep. 12, 2011  (JP) ................. 2011-198104
Sep. 7, 2012   (JP) ................. 2012-197038

(51) Int. Cl.
    *H01L 29/20*    (2006.01)
    *H01L 29/04*    (2006.01)

(52) U.S. Cl.
    USPC .......................... 257/615; 257/627

(58) Field of Classification Search
    USPC ............................... 257/615, 627
    See application file for complete search history.

(56) References Cited

U.S. PATENT DOCUMENTS

| | | | |
|---|---|---|---|
| 6,632,725 B2 | 10/2003 | Trassoudaine et al. | |
| 7,189,588 B2 | 3/2007 | Usui et al. | |
| 7,233,044 B2* | 6/2007 | Dudek | 257/343 |
| 7,592,629 B2 | 9/2009 | Lee et al. | |
| 8,420,502 B2* | 4/2013 | Ando et al. | 438/458 |
| 2012/0329245 A1* | 12/2012 | Uematsu et al. | 438/460 |
| 2013/0221490 A1* | 8/2013 | Shimodaira et al. | 257/615 |

FOREIGN PATENT DOCUMENTS

| | | |
|---|---|---|
| JP | 2004-039810 A | 2/2004 |
| JP | 2007-106667 A | 4/2007 |
| JP | 2007-320811 A | 12/2007 |

* cited by examiner

*Primary Examiner* — Ngan Ngo
(74) *Attorney, Agent, or Firm* — McGinn IP Law Group, PLLC

(57) ABSTRACT

A nitride semiconductor crystal producing method, a nitride semiconductor epitaxial wafer, and a nitride semiconductor freestanding substrate, by which it is possible to suppress the occurrence of cracking in the nitride semiconductor crystal and to ensure the enhancement of the yield of the nitride semiconductor crystal. The nitride semiconductor crystal producing method includes growing a nitride semiconductor crystal over a seed crystal substrate, while applying an etching action to an outer end of the seed crystal substrate during the growing of the nitride semiconductor crystal.

3 Claims, 12 Drawing Sheets

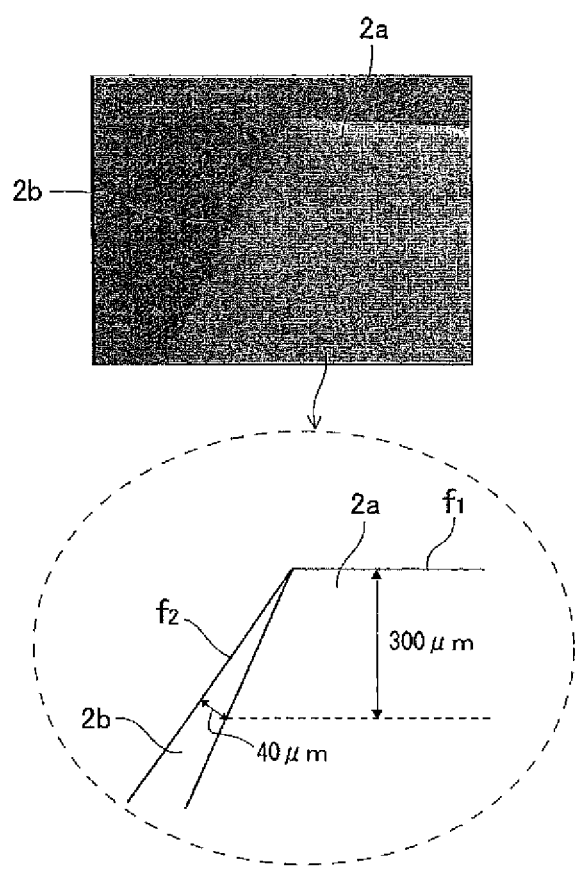

FIG.12
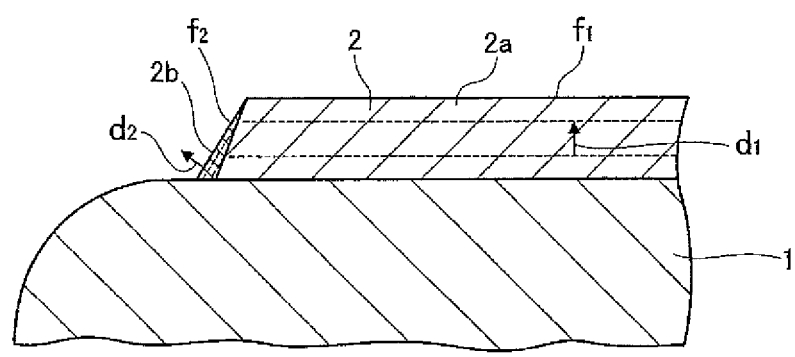
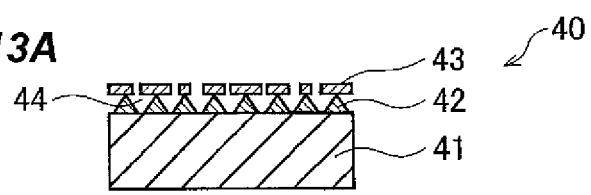
FIG.13A
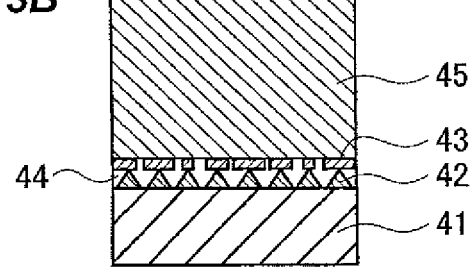
FIG.13B
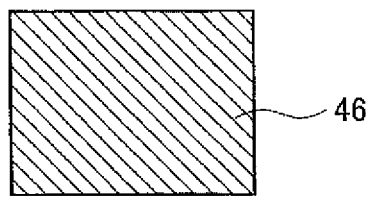
FIG.13C

NITRIDE SEMICONDUCTOR CRYSTAL PRODUCING METHOD, NITRIDE SEMICONDUCTOR EPITAXIAL WAFER, AND NITRIDE SEMICONDUCTOR FREESTANDING SUBSTRATE

The present application is based on Japanese patent application No. 2011-198104 filed on Sep. 12, 2011 and Japanese patent application No. 2012-197038 filed on Sep. 7, 2012, the entire contents of which are incorporated herein by reference.

BACKGROUND OF THE INVENTION

1. Field of the Invention

This invention relates to a nitride semiconductor crystal producing method, a nitride semiconductor epitaxial wafer, and a nitride semiconductor freestanding substrate.

2. Description of the Related Art

For GaN-based material growth, a vapor phase growth method, such as metal organic vapor phase epitaxy (MOVPE) or hydride vapor phase epitaxy (HVPE), is mainly used. In these growths, a seed crystal substrate, such as a sapphire substrate, SiC substrate, or nitride semiconductor substrate, is installed on a holder, a tray or the like, and a raw material gas is fed to the seed crystal substrate, to grow a nitride semiconductor. Specifically, in the metal organic vapor phase epitaxy, the nitride semiconductor is grown over the seed crystal substrate, by feeding an organometallic gas, such as trimethyl gallium (TMG), trimethyl aluminum (TMA) or the like, and ammonia. Also, in the hydride vapor phase epitaxy, the nitride semiconductor is grown over the seed crystal substrate, by feeding a group III raw material gas, such as gallium chloride (GaCl) gas, aluminum chloride (AlCl, $AlCl_3$) or the like, and ammonia to the seed crystal substrate installed on the holder, the tray or the like.

As the seed crystal substrate, a heterogeneous substrate made of sapphire, SiC, Si or the like, or a nitride semiconductor freestanding substrate made of GaN, AlN or the like is used. Over these seed crystal substrates, crystal growth is performed so that typically a group III polar c-face such as a Ga face is a front side, and that surface is used for device formation.

A problem arises in the nitride semiconductor crystal growth: When the grown layer of the nitride semiconductor becomes thick, cracking tends to occur in the grown layer.

In particular, in the thin film growth over the heterogeneous substrate, this problem arises when the thermal expansion coefficients of the seed crystal substrate and the nitride semiconductor layer grown thereover are significantly different. For example, in the growth of the GaN layer over the sapphire substrate, cracking tends to occur when the thickness of the GaN layer exceeds 5 to 6 µm. In the growth over the SiC substrate or over a Si substrate, even the thinner GaN layer of the order of 2 to 3 µm is likely to crack unless a complicated stress relaxation layer or the like is built therein. Such a limit to the growable GaN layer thickness causes such various inconveniences that types of applicable devices are limited, or enhancement of device properties is prevented.

The cracking mechanism in the thin film growth over the heterogeneous substrate is typically described as follows: Even when the GaN layer is grown over the heterogeneous substrate at a growth temperature (up to 1000 degrees Celsius), no significant stress occurs during the growth. After the growth, however, returning the temperature of the nitride semiconductor epitaxial wafer formed with the GaN layer over the heterogeneous substrate to room temperature causes stress due to a difference between thermal expansion coefficients, leading to bimetallic warping of the nitride semiconductor epitaxial wafer. In the GaN layer over the sapphire substrate, at thicknesses exceeding 5 to 6 µm, the stress exceeds the critical value, causing the GaN layer to crack. Herein, the critical thickness value (critical film thickness) of the GaN layer over the sapphire substrate is assumed to be 5 to 6 µm, but in practice that critical value varies according to growing apparatus used, growth conditions, etc., and as it stands, it is difficult to determine the definite growth thickness at which cracking occurs.

As well as cracking during thin film growth on the order of a few µm thickness described above, the occurrence of cracking has been a major problem even in the growth of the nitride semiconductor freestanding substrate having a few 100 µm to a few mm thickness.

There are two ways to fabricate the nitride semiconductor freestanding substrate: One way is to use the heterogeneous substrate as the seed crystal as in the case of the above-described thin film, and another way is to use the nitride semiconductor freestanding substrate as the seed crystal.

In the freestanding substrate production onto the heterogeneous substrate, the use of for example, a Void-Assisted Separation (VAS) method disclosed by Patent document 3 allows a void layer to mitigate the stress between the heterogeneous substrate and the nitride semiconductor layer grown thereover. For this reason, the occurrence of cracking due to the stress between the heterogeneous substrate and the nitride semiconductor layer as in the above described case of thin film growth is suppressed, and the nitride semiconductor layer having a film thickness of the order of 100 µm can be grown without cracking. However, even in this case, the situation at the initiation of growth is the same as in the case of thin film growth: The growth on a face tilted from the c-face occurs around an outer end from the beginning of the growth. This leads to the occurrence of stress. At thicknesses of the nitride semiconductor layer exceeding 100 µm, cracking tends to occur during the growing and cooling. Since the general thickness of the semiconductor wafer is required to be on the order of 400 µm to 1 mm from the point of view of ease of handling, it is necessary to grow such a very thick nitride semiconductor layer in the growth of the nitride semiconductor freestanding substrate as well. For this reason, the occurrence of cracking due to the presence of stress in the outer end is a serious problem which excessively reduces yield in the production of the nitride semiconductor freestanding substrate.

In order to remove a nitride semiconductor polycrystal adhering to an inner wall of a reactor or around a susceptor to place an underlying substrate, Patent document 1 (JP-A-2007-320811) has disclosed a method by introducing an etching gas into the reactor after growth, so that nitride semiconductor substrate cracking during cooling and damage to the inner wall of the reactor are suppressed. When growing the thick nitride semiconductor layer, the method of Patent document 1 has failed to reduce the occurrence of cracking during the growth, and has failed to increase the yield of the nitride semiconductor crystal, and has made small the obtainable area of the nitride semiconductor substrate due to an excess of the undesirable nitride semiconductor polycrystal around the susceptor. Also, Patent document 2 (U.S. Pat. No. 6,632,725) has disclosed a method by feeding HCl (hydrogen chloride gas) into a reactor as an etching gas during GaN growth, to reduce GaN adhering to an inner wall of the reactor. Further, in order to reduce warpage of a laminate with a GaN layer grown over a sapphire substrate, Patent document 4 (JP-A-2007-106667) has disclosed a method by nitriding and hydrogen chloride gas etching of the sapphire substrate, to form an uneven structure of an aluminum nitride in the surface of the sapphire substrate, so that GaN is grown over the sapphire substrate having that uneven structure of the aluminum nitride.

Patent Document 1: JP-A-2007-320811
Patent Document 2: U.S. Pat. No. 6,632,725
Patent Document 3: JP-A-2004-039810
Patent Document 4: JP-A-2007-106667

SUMMARY OF THE INVENTION

One of the reasons for it being difficult to determine that critical film thickness of the GaN thin film over the heterogeneous substrate is due to an end face effect.

Typically, in device fabrication, a Ga polar c-face is used. As shown in FIG. 1, the substantially entire surface of an epitaxial wafer formed with a nitride semiconductor over a heterogeneous seed crystal substrate 1 is covered with a nitride semiconductor crystal 2a grown on a Ga polar c-face $f_1$. However, conditions are different around an outer end of the epitaxial wafer from in an inner portion (i.e., a flat portion in the c-face growth). Around the outer end of the epitaxial wafer, a nitride semiconductor crystal 2b whose surface is a face $f_2$ tilted from the c-face $f_1$ is grown. In FIG. 1, there is shown a schematic manner in which the nitride semiconductor crystal 2, i.e., the GaN crystal begins to grow from the seed crystal substrate 1, i.e., the heterogeneous substrate (sapphire substrate, for example), and the crystal growth progresses as indicated by dotted lines, with time. That is, the c-face (growth face) $f_1$ of the nitride semiconductor crystal 2a grown over the principal surface (c-face, for example) of the seed crystal substrate 1 grows gradually as indicated by $f_{1-1}$, $f_{1-2}$ and $f_{1-3}$, and also the face (growth face) $f_2$ of the nitride semiconductor crystal 2b around the outer end grown on the face $f_2$ tilted from the c-face $f_1$ likewise grows gradually as indicated by $f_{2-2}$, $f_{2-2}$ and $f_{2-3}$.

In general, different crystal faces make their surface dangling bond densities or surface reconstructions different, therefore making their impurity incorporation efficiencies significantly different. For this reason, in the nitride semiconductor epitaxial wafer growth, the doped impurity concentrations in the nitride semiconductor crystal 2a in the inner portion of the wafer and in the nitride semiconductor crystal 2b around the outer end of the wafer are significantly different. Contacting the crystals with different impurity concentrations causes stress therebetween due to the difference between the impurity concentrations affecting elastic and plastic properties, thermal properties, lattice constants and the like of the crystals. That is, in the wafer with the growth face therearound different from the c-face, the region of the crystal 2b with the impurity concentration different from the impurity concentration of the c-face grown crystal 2a forms around the outer end, has significant inherent stress in the outer end, and leads to the occurrence of cracking. Due to the size of that different impurity concentration region around the outer end and the value of the impurity concentration in the outer end varying according to apparatus configuration and growth conditions, it is difficult to determine the critical film thickness of the GaN thin film over the heterogeneous substrate.

Also, the use of the nitride semiconductor freestanding substrate itself as the seed crystal substrate causes crystal growth on a face other than the c-face around the outer end of the nitride semiconductor crystal. This causes stress to occur, leading to cracking. That is, as shown in FIG. 2, installing a seed crystal substrate (freestanding nitride semiconductor substrate) 1 on an installation surface 4 of a tray 3, and growing a nitride semiconductor crystal 2 over the seed crystal substrate 1, a nitride semiconductor crystal 2b causing the occurrence of stress grown on the face $f_2$ tilted from the c-face $f_1$ grows around an outer end of a c-face grown nitride semiconductor crystal 2a grown on a principal surface (c-face, for example) of the seed crystal substrate 1. In addition, the use of the nitride semiconductor freestanding substrate as the seed crystal substrate may often cause strain due to the stress inherent to the nitride semiconductor freestanding seed crystal substrate itself as well as the stress in the outer end, or cause stress between the nitride semiconductor freestanding substrate (the seed crystal substrate) and the nitride semiconductor layer (the grown layer) grown thereover. These lead to the occurrence of cracking during the growing and cooling.

As described above, in either case of the thin film growth of the nitride semiconductor over the heterogeneous seed crystal substrate or the growth of the nitride semiconductor crystal over the nitride semiconductor freestanding seed crystal substrate, when deliberately growing the intended nitride semiconductor crystal over the principal surface or the like of the seed crystal substrate, a nitride semiconductor crystal other than the deliberately grown nitride semiconductor crystal exists as, for example, the outer end of the nitride semiconductor crystal or the seed crystal nitride semiconductor freestanding substrate. These lead to the occurrence of stress, and to the occurrence of cracking in the nitride semiconductor crystal.

Accordingly, it is an object of the invention to provide a nitride semiconductor crystal producing method capable of suppressing the occurrence of cracking in the nitride semiconductor crystal and thereby ensuring the enhancement of the nitride semiconductor crystal yield, and a nitride semiconductor epitaxial wafer and a nitride semiconductor freestanding substrate realized by that method.

According to a first embodiment of the invention, a nitride semiconductor crystal producing method comprises growing a nitride semiconductor crystal over a seed crystal substrate, while applying an etching action to an outer end of the seed crystal substrate during the growing of the nitride semiconductor crystal.

According to a second embodiment of the invention, in the nitride semiconductor crystal producing method according to the first embodiment, the nitride semiconductor crystal producing method further comprises installing the seed crystal substrate in a container with an inner surface and a sidewall for surrounding an outer side of the seed crystal substrate, wherein an environment adjacent to a portion of the inner surface of the container, which is not contacted with the seed crystal substrate at growth initiation, is an environment to which an etching action is applied during the nitride semiconductor crystal growing, so that the nitride semiconductor crystal is grown in no contact with the portion of the inner surface of the container throughout an entire period of crystal growth, and in a cross-sectional shape similar to an inner cross-sectional shape of the container.

According to a third embodiment of the invention, in the nitride semiconductor crystal producing method according to the second embodiment, the inner surface of the container, which is not contacted with the nitride semiconductor crystal, includes a side surface of the sidewall.

According to a fourth embodiment of the invention, in the nitride semiconductor crystal producing method according to the second or third embodiment, the inner surface of the container, which is not contacted with the nitride semiconductor crystal, includes a surface on a side in which the seed crystal substrate is installed.

According to a fifth embodiment of the invention, in the nitride semiconductor crystal producing method according to any one of the second to fourth embodiments, the environment adjacent to the portion of the inner surface of the container, which is not contacted with the nitride semiconductor crystal, is an environment in which the etching action weakens with distance from a side surface of the sidewall.

According to a sixth embodiment of the invention, in the nitride semiconductor crystal producing method according to any one of the second to fifth embodiments, the nitride semiconductor crystal is grown in an environment of coexistence of growth and etching, and the etching action is strengthened by diluting a growing raw material adjacent to the portion of the inner surface of the container, which is not contacted with the nitride semiconductor crystal.

According to a seventh embodiment of the invention, in the nitride semiconductor crystal producing method according to any one of the sixth embodiment, the growing raw material is diluted by feeding an inert gas containing nitrogen, argon or helium.

According to an eighth embodiment of the invention, in the nitride semiconductor crystal producing method according to any one of the second to fifth embodiments, the etching action is applied by feeding an etching gas or liquid adjacent to the portion of the inner surface of the container, which is not contacted with the nitride semiconductor crystal.

According to a ninth embodiment of the invention, in the nitride semiconductor crystal producing method according to the eighth embodiment, the etching gas contains at least any one of hydrogen, chlorine, and hydrogen chloride.

According to a tenth embodiment of the invention, in the nitride semiconductor crystal producing method according to any one of the second to fourth embodiments, the nitride semiconductor crystal is grown by feeding a substance for producing an etching species through a catalytic action, and at least a portion of the inner surface of the container, which is not contacted with the nitride semiconductor crystal, comprises a catalyst having the catalytic action, to thereby develop the etching action.

According to an eleventh embodiment of the invention, in the nitride semiconductor crystal producing method according to the tenth embodiment, the substance for producing the etching species through the catalytic action is a hydrogen gas.

According to a twelfth embodiment of the invention, in the nitride semiconductor crystal producing method according to the tenth or eleventh embodiment, the catalyst having the catalytic action is a metal or a metal nitride.

According to a thirteenth embodiment of the invention, in the nitride semiconductor crystal producing method according to the twelfth embodiment, the metal is any of Ti, Zr, Nb, Ta, Cr, W, Mo, or Ni.

According to a fourteenth embodiment of the invention, in the nitride semiconductor crystal producing method according to any one of the second to thirteenth embodiments, a distance between the etching action-producing inner surface of the container, which is not contacted with the nitride semiconductor crystal, and the nitride semiconductor crystal, ranges from 1 to 10 mm, for a period from crystal growth initiation until termination.

According to a fifteenth embodiment of the invention, in the nitride semiconductor crystal producing method according to any one of the second to fourteenth embodiments, an angle between a side surface of the sidewall and a placement surface of the container on which the seed crystal substrate is placed ranges greater than 90 degrees and not greater than 135 degrees, so that the inner cross section of the container is shaped to expand toward its opening side, and the nitride semiconductor crystal is grown having a nitrogen face as a growth face, while expanding its diameter.

According to a sixteenth embodiment of the invention, a nitride semiconductor epitaxial wafer comprises:

a plate-like seed crystal substrate; and a nitride semiconductor crystal grown over the seed crystal substrate, wherein the nitride semiconductor crystal includes a nitride semiconductor crystal grown in a principal surface direction of the seed crystal substrate, but around an outer end of the nitride semiconductor crystal grown in the principal surface direction, there is included no nitride semiconductor crystal grown in a face direction tilted from the principal surface, and having a higher impurity concentration than the nitride semiconductor crystal grown in the principal surface direction, or even when there is included the nitride semiconductor crystal having the higher impurity concentration around the outer end, a growth thickness of the nitride semiconductor crystal having the higher impurity concentration around the outer end is less than one tenth of a growth thickness of the nitride semiconductor crystal grown in the principal surface direction.

According to a seventeenth embodiment of the invention, in the nitride semiconductor epitaxial wafer according to the sixteenth embodiment, the seed crystal substrate is a sapphire substrate, and the nitride semiconductor crystal is a GaN layer, and let a curvature radius of the nitride semiconductor epitaxial wafer be R (m), a thickness of the GaN layer be t (μm), a thickness of the sapphire substrate be Y (μm), and a coefficient be A, then the following relations (1) and (2) are satisfied.

$$R = A/t \qquad (1)$$

$$A > 0.00249 \times Y^{1.58483} \qquad (2)$$

According to an eighteenth embodiment of the invention, a plate-like nitride semiconductor freestanding substrate comprises a nitride semiconductor crystal grown in a principal surface direction of the nitride semiconductor freestanding substrate, wherein around an outer end of the nitride semiconductor freestanding substrate, there is included no nitride semiconductor crystal having a higher impurity concentration than the nitride semiconductor crystal grown in the principal surface direction, or even when there is included the nitride semiconductor crystal having the higher impurity concentration around the outer end, a growth thickness of the nitride semiconductor crystal having the higher impurity concentration around the outer end is less than one tenth of a growth thickness of the nitride semiconductor crystal grown in the principal surface direction.

(Points of the Invention)

According to the invention, it is possible to suppress the occurrence of cracking in the nitride semiconductor crystal grown over the seed crystal substrate and thereby ensure the enhancement of the yield.

BRIEF DESCRIPTION OF THE DRAWINGS

Next, the preferred embodiments according to the invention will be explained below referring to the drawings, wherein:

FIGS. 8A to 8C are graphs showing properties of a GaN layer formed over a sapphire substrate in example 1 according to the invention and comparative example 1, wherein FIG. 8A is a graph showing a relationship between GaN layer thickness and yield; FIG. 8B is a graph showing a relationship between GaN layer thickness and (0002) diffraction full width at half maximum; and FIG. 8C is a graph showing a relationship between GaN layer thickness and (10-12) diffraction full width at half maximum;

FIG. 9 is a diagram showing an image of a cross section of a GaN crystal formed over a seed crystal substrate observed by a fluorescence microscope in comparative example 1;

FIGS. 11A to 11C are graphs showing results of measuring curvature radii R of epitaxial wafers produced when growing GaN layers with various thicknesses over sapphire substrates with various thicknesses, using an example 1 method and a comparative example 1 method, wherein FIG. 11A is a graph showing the results when growing the GaN layers over a sapphire substrate with 50 mm diameter and 350 μm thickness; FIG. 11B is a graph showing the results when growing the GaN layers over a sapphire substrate with 100 mm diameter and 900 μm thickness; and FIG. 11C is a graph showing the results when growing the GaN layers over a sapphire substrate with 150 mm diameter and 1500 μm thickness;

FIG. 12 is a schematic cross-sectional view showing a vicinity of an outer end of a GaN layer grown over a heterogeneous seed crystal substrate using the HVPE apparatus of FIG. 10 in example 1;

FIG. 13 is a process diagram illustrating a VAS method for producing a GaN freestanding substrate used in example 10 and comparative example 2;

DETAILED DESCRIPTION OF THE PREFERRED EMBODIMENTS (Finding)

The inventors have made an earnest study to solve the drawback that cracking tends to occur during nitride semiconductor growing. As a result, it has been found that as described above, when grown over a seed crystal substrate made of a heterogeneous substrate or a nitride semiconductor freestanding substrate, crystals having properties different from those of a crystal to be grown over an intended growth face (e.g. over a principal surface of the seed crystal substrate) are present, for example around an outer end of a deliberately grown nitride semiconductor crystal, or as the seed crystal substrate itself, those crystals cause stress to occur between them and the nitride semiconductor crystal over the intended growth face, and this leads to cracking during the growth.

Based on this finding, the inventors have arrived at a nitride semiconductor crystal producing method of the invention, which applies an etching action to a growing portion (in particular, a growing outer end) over a face other than the intended growth face of the nitride semiconductor crystal to suppress the growth of the outer end which causes stress, or gradually etches the growing nitride semiconductor freestanding seed crystal substrate which causes stress, to thereby suppress cracking during the growth of the nitride semiconductor crystal.

Below are described a nitride semiconductor crystal producing method, a nitride semiconductor epitaxial wafer, and a nitride semiconductor freestanding substrate in an embodiment according to the invention.

Figure 3A:
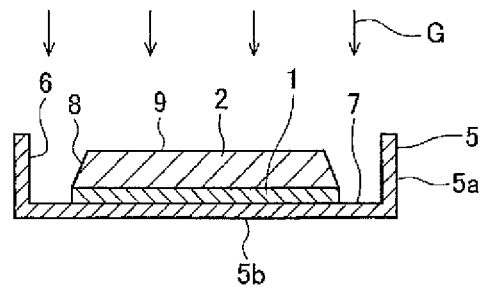
FIGS. 3A and 3B are a cross-sectional view and a plan view, respectively, showing an essential construction of a nitride semiconductor crystal producing method in one embodiment according to the invention.
Figure 3B:
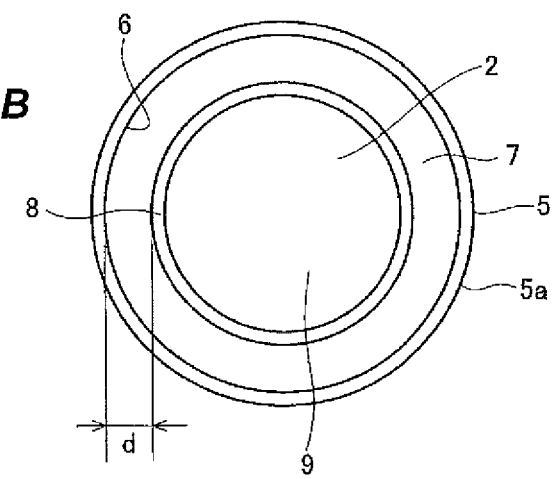

As shown in, for example FIGS. 3A and 3B, the nitride semiconductor crystal producing method in one embodiment according to the invention installs a seed crystal substrate 1 on a bottom wall 5b in a crucible shape or shallow cup-shaped crucible container 5 having a sidewall 5a surrounding an outer side of the seed crystal substrate 1, feeds a raw material gas G onto a growth surface of the seed crystal substrate 1 (onto a principal surface of the seed crystal substrate 1), and grows a nitride semiconductor crystal 2 over the seed crystal substrate 1. An environment or atmosphere adjacent to an inner surface portion of the container 5 (in FIGS. 3A and 3B, a side surface 6 of a sidewall 5a and a portion adjacent to the side surface 6 of a bottom surface 7 of a bottom wall 5b) which is not contacted with the seed crystal substrate 1 at the initiation of the growth is defined as an environment or atmosphere to apply an etching action to the growing nitride semiconductor crystal 2. This allows for the nitride semiconductor crystal 2 being grown in no contact with the portion of the inner surface of the container 5 throughout an entire period of crystal growth, and in a cross-sectional shape similar to an inner cross-sectional shape (a circular shape in FIGS. 3A and 3B) of the container 5.

It is preferred that the above described inner surface of the container which is not contacted with the nitride semiconductor crystal includes the side surface of the sidewall of the container. In addition, if the nitride semiconductor crystal is grown over the seed crystal substrate which is the nitride semiconductor freestanding substrate, it is preferred that the above described inner surface of the container which is not contacted with the nitride semiconductor crystal includes a surface on a side in which the nitride semiconductor free-standing substrate is installed, in addition to the side surface of the sidewall of the container.

It is preferred that the above described etching environment or etching atmosphere adjacent to the portion of the inner surface of the container, which is not contacted with the nitride semiconductor crystal, is such that the etching action weakens with distance from the inner surface of the container. In the case where the etching action does not weaken with distance from the inner surface, much of the nitride semiconductor crystal grown during a growth period may be etched.

Further, even when the etching action attenuates with distance from the inner surface, if the etching action is too strong even at a distance from the inner surface, the layer grown over the principal surface of the nitride semiconductor crystal is lost. In addition, if the etching action is too weak, growth at an unintended face (end face, for example) occurs in the grown layer of the nitride semiconductor crystal, causing stress in the growing nitride semiconductor crystal, to crack the nitride semiconductor crystal. From these, the strength of the etching action and the degree of the weakening (attenuation) of the etching action with distance from the inner surface of the container are required to be appropriately selected to prevent the occurrence of excessive stress, or remove stress.

The presence of this etching action adjacent to the side surface 6 of the crucible shaped container 5 as shown in FIGS. 3A and 3B, for example, suppresses the growth around the outer end (end face) 8 of the nitride semiconductor crystal 2 grown over the seed crystal substrate 1. That is, the growth of the crystal of the outer end 8 different in impurity concentration from the crystal of the deliberately grown face (for example, c-face) 9 can be suppressed, so that the occurrence of cracking due to stress caused by the crystal of the outer end 8 can be suppressed. In this case, it is feasible to grow the nitride semiconductor crystal with the cross-sectional shape substantially similar to the cross-sectional shape (circular shape in FIGS. 3A and 3B) of the inner surface of the container, and in no contact with the inner surface portion of the container throughout the entire period of growth, which is not contacted with the seed crystal substrate at the initiation of the growth. Since the outer portion of the seed crystal substrate 1 is not open, and the sidewall 5a of the container 5 is provided to surround the outer side of the seed crystal substrate 1, it is possible to form and maintain the etching environment or etching atmosphere which allows the selective etching of the nitride semiconductor crystal of the outer end 8.

In this case, in the above etching action, the growth rate of the crystal of the outer end is preferably 0. This is a state in which the etching action and the growth are balanced. In other words, since the outer end is the etching action applying environment or atmosphere, the growth of the outer end can be suppressed. However, if the growth rate in the normal direction to the growth face of the outer end is less than one-tenth of the growth rate in the normal direction to the intended growth face (e.g., the growth face grown in the normal direction to the principal surface (for example, c-face) of the seed crystal substrate, the effect of preventing cracking can be provided. In the case of one-tenth or more, excessive stress occurs, increasing the probability of occurrence of cracking.

Further, when causing the outer end to etch, the etching rate in the normal direction to the etching face is preferably not more than the growth rate of the intended growth face. This is because even if the etching rate of the outer end is greater than the growth rate of the intended growth face, the effect of preventing cracking is provided, but the size of the finally resulting crystal is very small.

Also, when growing the nitride semiconductor over the nitride semiconductor free-standing substrate which is the seed crystal substrate, the presence of this etching action on the face on the side in which the nitride semiconductor free-standing substrate is installed allows the gradual etching of the back side of the seed crystal substrate during growth. Therefore, in a stage a new nitride semiconductor growth layer is grown to be thick on the surface side of the seed crystal substrate, the stress due to the seed crystal substrate can be removed or reduced, to suppress the occurrence of cracking during the growth.

This case has a good result if the etching rate of the back side of the seed crystal substrate is not less than one hundredth of the growth rate on the intended growth face. Also, when the etching rate of the back side of the seed crystal substrate is high, it is assumed that after growth the nitride semiconductor becomes smaller in entire thickness than the initial nitride semiconductor freestanding substrate. To avoid such a situation, the etching rate of the back side of the seed crystal substrate is preferably not more than half the growth rate on the intended growth face.

In addition, the above etching action is applied preferably symmetrically with respect to a certain point, line or face in the crystal grown in order to maintain stress balance during the growth. When one side of the crystal substrate, for example, the disc-shaped seed crystal substrate is the intended growth face, it is preferred to use the container which is circular in cross section, so that the etching action is applied evenly to the end face around the crystal. Also, when one side of the seed crystal substrate having such a polygonal plate shape as a square plate shape, hexagonal plate shape, etc. is the principal growth face, it is preferred to use the container whose cross-sectional shape is similar to the cross-sectional shape of the seed crystal substrate, so that the etching action is applied evenly to the end face around the nitride semiconductor crystal over the seed crystal substrate. Further, the seed crystal substrate of the present invention is not limited to the plate shape, but seed crystals of each kind are included. For example, when a circumferential face or polygonal face of the seed crystal substrate having a columnar shape or polygonal pyramid is the principal growth face, it is preferred to apply the etching action evenly to a side surface relative to the principal growth face.

Further, when applying the etching action to the back side of the seed crystal substrate, it is preferred to apply the etching action evenly to its entire face, or apply the etching action symmetrically with respect to a point or a line in the face. However, in order to, apply the etching action to the back side of the seed crystal substrate that faces the inner surface of the container, it is necessary to space the back side of the seed crystal substrate a constant distance from the inner surface of the container, for example it is necessary to install the seed crystal substrate in the container via a block smaller than the seed crystal substrate. In this case, it is preferred to use a plurality of the sufficiently small blocks, so that the area of the face hidden by contact with the block is not more than one-tenth of the area of the entire back side of the seed crystal substrate. It is because if this ratio is too high, the effect of stress relaxation due to the etching of the seed crystal substrate cannot sufficiently be provided.

Figure 6:
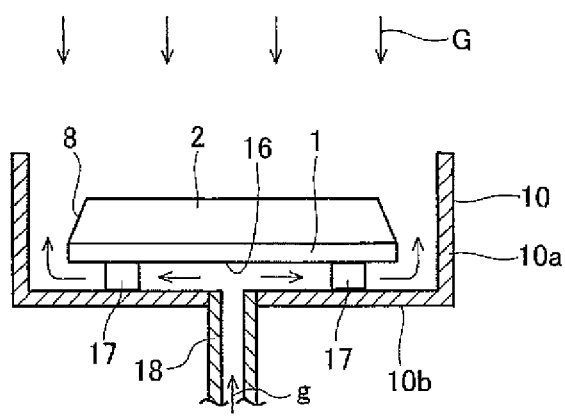
FIG. 6 is a cross-sectional view showing an essential construction of a nitride semiconductor crystal producing method in another embodiment according to the invention.

Specifically, for example, as shown in FIG. 6, the seed crystal substrate 1 is installed via a plurality of blocks 17 on a bottom wall 10*b* of a container 10 having a sidewall 10*a*, and a gas g is introduced to apply the etching action to the back side of the seed crystal substrate 1. In FIG. 6, a middle portion of the bottom wall 10*b* of the container 10 is connected with a feed pipe 18 to feed the gas g, so that the gas g introduced from the feed pipe 18 flows between the bottom wall 10*b* of the container 10 and the seed crystal substrate 1. The back side 16 of the seed crystal substrate 1 is etched by the gas g. In addition, the gas g that flows along the back side 16 is injected from between the sidewall 10*a* of the container 10 and the outer portion of the seed crystal substrate 1, to etch mainly the nitride semiconductor crystal 2 of the outer end 8, of the nitride semiconductor crystal 2 grown over the seed crystal substrate 1.

The above etching action is preferably steadily applied, but may intermittently be applied. For example, one preferred method to achieve the object of the present invention is to cause the gas with the etching action to flow steadily around the wafer, but in this case it is necessary to locate a gas injection hole around the entire wafer. On the other hand, the entire wafer perimeter or the entire wafer back side may also be etched intermittently by providing an injection hole for a gas having the etching action in only a portion of the wafer perimeter, or spraying a gas having the etching action on the wafer perimeter in one direction, and rotating the wafer. If the etching action is sufficient, this method has the merit that apparatus construction is convenient.

There are several ways to develop the etching action described above. One preferred method is to grow the nitride semiconductor in an environment of coexistence of growth and etching, dilute the growing raw material adjacent to the face to which the above etching action is applied, and thereby strengthen the above etching action. As the environment of coexistence of growth and etching, there is, for example, a case of vapor phase growth such as MOVPE growth, HVPE growth or the like, in which hydrogen, chlorine, hydrogen chloride or the like is added to a growth atmosphere. In this case, the growing raw material is diluted preferably by feeding an inert gas, such as nitrogen, argon, helium or the like. The growing raw material in the raw material gas G is diluted by, for example, in FIGS. 3A and 3B, adding in the raw material gas G a gas having the etching action, such as hydrogen, chlorine, hydrogen chloride or the like in addition to the growing raw material (group III raw material and group V raw material), and feeding the inert gas, such as nitrogen, argon, helium or the like to the vicinity of the side surface 6 of the container 5.

A desirable value of an added amount of these diluting gases (inert gases) to provide the appropriate etching action is preferably set to realize the above growth rate and the above etching rate in the range of from one-tenth to ten times the feed amount of the group III raw material, though varying according to growth conditions.

Further, the present invention may also be applied to growth using a solution performed in a closed system, as in a Na flux method, an ammonothermal synthesis method or the like. In these cases, the etching action is developed by forcedly introducing the solution which is lower in raw material solubility than the solution in the vicinity of the deliberately grown face, into the vicinity of the face to which the etching action is applied.

The above described etching action may be developed by feeding a gas or liquid (solution) with the etching action into the vicinity of the face to which the etching action is applied.

The above described gas with the etching action preferably contains at least any one of hydrogen, chlorine, or hydrogen chloride. In order to provide the appropriate etching action, a desirable value of an added amount of these etching gases is preferably set to realize the above growth rate and the above etching rate in the range of from one-tenth to ten times the feed amount of the group III raw material, though varying according to growth conditions.

In the Na flux method or ammonothermal synthesis method, the solution, which is lower in growing raw material solubility than the solution in the vicinity of the deliberately grown face, is liquid (solution) having the etching action in the same manner as described above.

Figure 4:
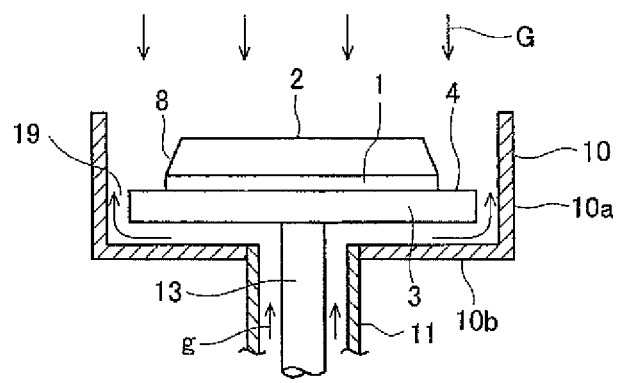
FIG. 4 is a cross-sectional view showing an essential construction of a nitride semiconductor crystal producing method in another embodiment according to the invention.

In FIG. 4, there is shown one embodiment of the above method which feeds the gas with the etching action in the vicinity of the face to which the etching action is applied. A container in this embodiment is composed mainly of a cup-shaped container 10 having a sidewall 10*a*, and a tray 3 to place a seed crystal substrate 1. A placement surface (installation surface) 4 of the tray 3 and the side surface of the sidewall 10*a* are configured as an inner surface of the shallow cup-shaped container, so that the gas g with the etching action is introduced from a bottom surface perimeter of the inner surface of this container to the outer portion in this container.

A middle portion of a bottom wall 10*b* of the container 10 is connected with a feed pipe 11 to feed the gas g with the etching action. The feed pipe 11 is inserted therein and a support shaft 13 to support the tray 3 is provided therein. The tray 3 on the support shaft 13 is arranged with a predetermined gap between it and the bottom wall 10*b* of the container 10. The gas g fed to the middle portion of the bottom wall 10*b* of the container 10 from the feed pipe 11 flows radially around the support shaft 13 and between the tray 3 and the bottom wall 10*b*, and flows out from an annular gas injection hole (gas outlet) 19 formed between the outer surface of the tray 3 and the inner surface of the sidewall 10*a*. On the other hand, the raw material gas G containing the growing raw material is fed to the growth face (the principal surface) of the seed crystal substrate 1 installed on the placement surface 4 of the tray 3, to grow the nitride semiconductor crystal 2 over the seed crystal substrate 1. The outer end 8 of the nitride semiconductor crystal 2 is subjected to a predetermined etching due to the gas g with the etching action injected from the gas injection hole 19.

Also, the etching action may be developed by growing the nitride semiconductor crystal while feeding a substance for producing an etching species through a catalytic action, and by making at least a portion of the inner surface of the container, which is not contacted with the above described nitride semiconductor crystal, from a catalyst. Because of requiring no local gas or liquid introduction, this method has the merit of being able to be implemented with a more convenient apparatus than the previously mentioned two methods.

The above described substance for producing the etching species through the catalytic action is preferably a hydrogen gas, and the catalyst is preferably a metal or a metal nitride.

The hydrogen gas etching is assumed to be performed by the hydrogen gas contacting the catalyst made of the metal or metal nitride in a high temperature condition to produce atomic hydrogen with the strong etching action, and the resulting atomic hydrogen diffusing and reaching the nitride semiconductor crystal. The atomic hydrogen is unstable, reacts in a short time and disappears. Therefore, the etching action due to the atomic hydrogen attenuates rapidly with increasing distance from the inner surface of the container, to etch only the nitride semiconductor crystal lying in the inner side at a constant distance from the inner surface of the container. That is, the vicinity of the inner surface of the container is the atmosphere in which the etching action weakens with distance from the inner surface of the container, therefore allowing appropriate etching without much of the nitride semiconductor crystal being etched due to excessive etching of the nitride semiconductor crystal, or without the occurrence of cracking in the nitride semiconductor crystal due to insufficient etching.

Further, as the above described catalyst metal, Ti (titanium), Zr (zirconium), Nb (niobium), Ta (tantalum), Cr (chromium), W (tungsten), Mo (molybdenum), and Ni (nickel) are preferred. For example, it is one preferred embodiment of the present invention to nitride the inner surface of the container made of the above described metal solid material in the nitride semiconductor crystal growing apparatus prior to growing the nitride semiconductor, and then perform the crystal growth. In addition, the inner surface of the container, which is not contacted with the nitride semiconductor crystal, may be formed with a film of the above described metal or metal nitride.

In this method, for example, in FIGS. 3A and 3B, the hydrogen gas may be added as the raw material gas G, and the side surface 6 of the container 5 may be formed of the above described metal or metal nitride. Also, for example, in FIG. 4 or 6, the hydrogen gas may be contained in the raw material gas G, and the inner surface of the sidewall 10a of the container 10, or the bottom wall 10b of the container 10 in FIG. 4 or 6 may be formed of the above described metal or metal nitride.

The distance between the sidewall of the container that is not contacted with the above-mentioned nitride semiconductor crystal and the nitride semiconductor crystal is preferably in the range of 1 to 10 mm for the period from the initiation of growth until the end of the growth. If this distance is shorter than 1 mm, a slight variation in growth conditions causes the nitride semiconductor crystal to be contacted with the inner surface of the container, to fix the container and the nitride semiconductor crystal, and due to the fixation, stress occurs to crack the nitride semiconductor crystal. On the other hand, if this distance is longer than 10 mm, the steep attenuation of the etching action is lost, and only the outer end growth cannot selectively be inhibited by etching. The distance between the inner surface of the container and the nitride semiconductor crystal is a distance d as shown in FIG. 3B, for example.

In the nitride semiconductor epitaxial wafer with the nitride semiconductor crystal grown over the plate shaped seed crystal substrate realized by the above described nitride semiconductor crystal producing method, the nitride semiconductor crystal does not include a nitride semiconductor crystal grown in a principal surface direction of the seed crystal substrate, and around an outer end of the nitride semiconductor crystal grown in the principal surface direction, a nitride semiconductor crystal grown in a face direction tilted from the principal surface, and having a higher impurity concentration than the nitride semiconductor crystal grown in the principal surface direction. Or, even when the nitride semiconductor crystal includes them, the nitride semiconductor epitaxial wafer is produced such that a growth thickness of the nitride semiconductor crystal having the higher impurity concentration is less than one tenth of a growth thickness of the nitride semiconductor crystal grown in the principal surface direction.

For this reason, during the growth and during cooling, the occurrence of cracking of the nitride semiconductor crystal is suppressed dramatically, and a high yield is feasible. The term "high impurity concentration" herein means that although the nitride semiconductor crystal grown in the principal surface direction which is the crystal over the intended face has its in-plane impurity concentration distribution to some degree, the impurity concentration is exceedingly higher (for example, 2 times or more) than a maximum value of the impurity concentration in that distribution, but does not mean an impurity concentration value exceedingly higher than a maximum value of the impurity concentration within the range of the impurity concentration distribution in the crystal over the intended principal surface or in the crystal over the principal surface. Even when growing the nitride semiconductor crystal with a high impurity concentration around the outer end of the nitride semiconductor epitaxial wafer, if its growth thickness is less than one-tenth of the growth thickness of the nitride semiconductor crystal grown in the principal surface direction, the occurrence of cracking during the growth and during cooling is suppressed, and further the warpage of the nitride semiconductor epitaxial wafer can also be reduced.

In the above-described nitride semiconductor epitaxial wafer, in particular, in the epitaxial wafer with the GaN layer grown over the sapphire substrate, the epitaxial wafer with warpage smaller than the conventional epitaxial wafer can be realized. Typically, when the GaN layer is grown over the sapphire substrate, when the surface of the GaN layer is faced upward, the epitaxial wafer is warped upward in a convex shape. Around the outer end of the nitride semiconductor epitaxial wafer fabricated by the conventional producing method, the nitride semiconductor crystal with high impurity concentration is grown one-tenth or more of the growth thickness of the nitride semiconductor crystal grown in the principal surface direction, and the radius of curvature of the nitride semiconductor epitaxial wafer is small, and the amount of warpage is increased. On the other hand, the nitride semiconductor epitaxial wafer produced by the producing method in the embodiment according to the present invention has a large radius of curvature, and the amount of warpage is reduced.

Figure 11A:
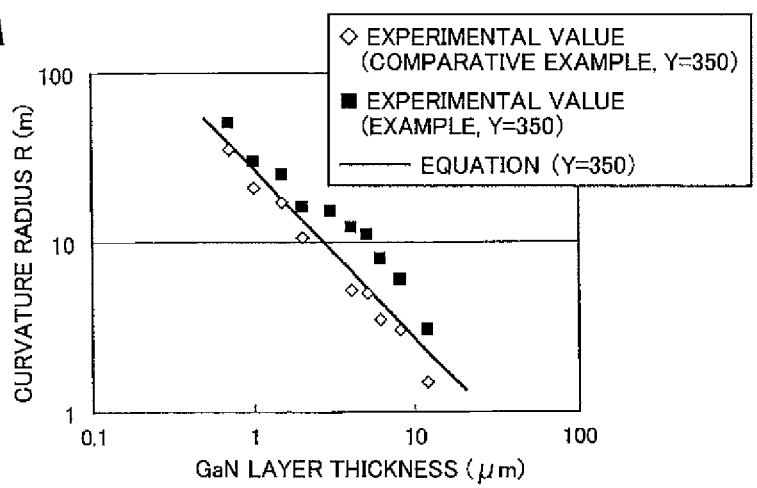
Figure 11B:
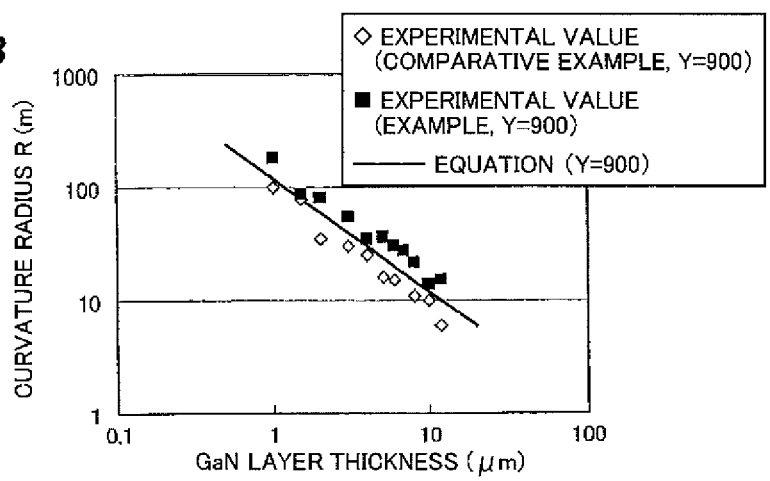
Figure 11C:
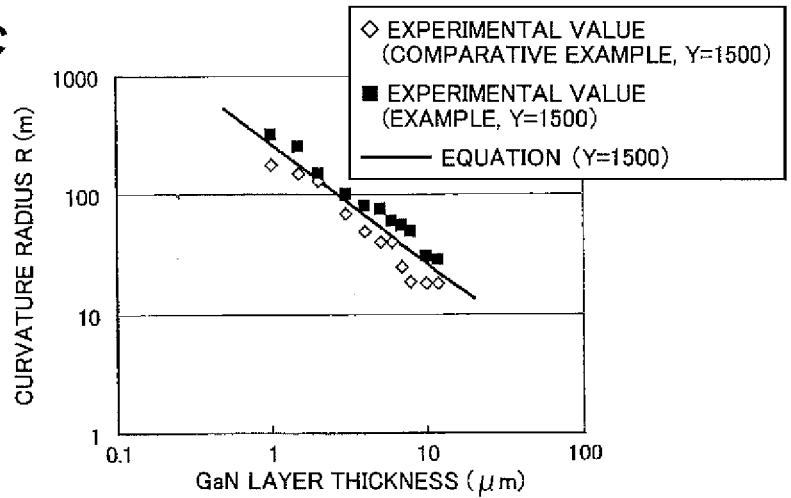

In FIGS. 11A to 11C, there are shown results of measurement of the radius R of curvature of epitaxial wafers produced when growing GaN layers with various thicknesses t over sapphire substrates with various thicknesses Y, using the growth method of the present invention and the conventional producing method. FIG. 11A shows data when the GaN layers are grown over the sapphire substrate of 50 mm diameter and 350 μm thickness, FIG. 11B shows data when the GaN layers are grown over the sapphire substrate of 100 mm diameter and 900 μm thickness, and FIG. 11C shows data when the GaN layers are grown over the sapphire substrate of 150 mm diameter and 1500 μm thickness.

The relationship between the growth thickness of the nitride semiconductor crystal grown in the principal surface direction of the nitride semiconductor epitaxial wafer and the warpage of the nitride semiconductor epitaxial wafer is studied. It is found that the following relation (1) holds. Let a curvature radius of the epitaxial wafer be R (m), a thickness of the GaN layer be t (μm), and a coefficient be A, then the curvature radius R of the epitaxial wafer can be written as follows.

$$R = A/t \tag{1}$$

From these results, by comparison of the epitaxial wafer produced by the production method of the present invention and the epitaxial wafer produced by the conventional producing method, it is clear that the sapphire substrate thickness Y (μm) and the coefficient A has a correlation expressed by the following formula.

In the case of the GaN layer over the sapphire grown by the conventional method, when the thickness of the sapphire substrate is Y (μm), the coefficient A is $$A \leq 0.00249 \times Y^{1.58483} \tag{3}$$

but by using the nitride semiconductor crystal producing method in the embodiment according to the invention, $$A > 0.00249 \times Y^{1.58483} \quad (2)$$

Thus, it is clear that the curvature radius can be increased more.

The epitaxial wafer with the large curvature radius, i.e. the small amount of warpage is advantageous in the case of forming a light emitting diode or a transistor structure on the above described GaN layer, and applying a photolithographic process to this. This is because in the photolithography process, if the epitaxial wafer is warped significantly, there are such adverse effects that the resolution of an element pattern transferred to the epitaxial wafer is degraded, and it is impossible to form a fine element, and also the yield in the photolithography process decreases.

Also the nitride semiconductor freestanding substrate realized by the above described nitride semiconductor crystal producing method does not include around an outer end thereof a nitride semiconductor crystal having a higher impurity concentration than the nitride semiconductor crystal grown in the principal surface direction of the nitride semiconductor freestanding substrate. Or, even when including it, the nitride semiconductor freestanding substrate is produced such that a growth thickness of the nitride semiconductor crystal having the higher impurity concentration around the outer end is less than one tenth of a growth thickness of the nitride semiconductor crystal grown in the principal surface direction.

For this reason, during the growth and during cooling, the occurrence of cracking of the nitride semiconductor crystal is suppressed dramatically, and a high yield is feasible. The meaning of the "high impurity concentration" herein is the same as in the case of the above described nitride semiconductor epitaxial wafer.

Although in the above, the GaN crystal whose deliberately grown face is the Ga polar c-face has been described, the present invention can, in principle, be applied to the case that a group DI polar c-face of AlN, InN, BN and a mixed crystal of these, or all other faces thereof are the intended growth face. For example, a face tilted in a direction of an a-axis or m-axis or in a direction between them in the range of 0.1 to 2 degrees from the group III polar c-face, or an N polar c-face, a-face, m-face, r-face, or other semipolar faces, or a vicinal face to those N polar faces or semipolar faces can be the intended growth face.

Further, the present invention can be applied to the case that the nitride semiconductor crystal is grown in the form that the N polar c-face is the surface. In this case, for the seed crystal substrate, the N polar face is arranged as the surface (the deliberately grown face), and crystal growth is performed thereover. In this case, the end face of the nitride semiconductor crystal has an opposite slope to that of FIG. 2, and the N polar c-face is expanded with the growth. For this reason, the growth of the nitride semiconductor crystal with the N polar face growth is a very effective method in order to realize the nitride large diameter semiconductor substrate (nitride semiconductor freestanding substrate).

However, in the case of using the conventional art HVPE apparatus, in the N polar face growth, stress occurs due to the growth around the end face as in the growth over the group III polar face, making it difficult to achieve a high yield.

However, using the nitride semiconductor crystal producing method of the present invention allows the growth of the nitride semiconductor freestanding substrate with a high yield even in the N polar face growth.

Figure 5:
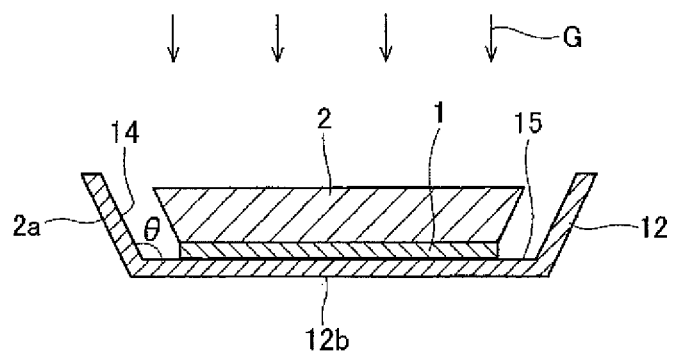
FIG. 5 is a cross-sectional view showing an essential construction of a nitride semiconductor crystal producing method in another embodiment according to the invention.

Specifically, as shown in FIG. 5, an angle θ between a side surface 14 of a sidewall 12a of a container 12 and a placement surface 15 of a bottom wall 12b of the container 12 to place the seed crystal substrate 1 ranges greater than 90 degrees and not greater than 135 degrees, and the inner cross-section of the container 12 is shaped to expand toward its opening, and the nitride semiconductor crystal 2 may be grown with its nitrogen face being the growth face and with its diameter being expanded.

In particular, in the N polar face growth, the sidewall is located so that the angle between the installation surface and the side surface of the container is open upward in the range of greater than 90 degrees (the side surface perpendicular to the installation surface) and not greater than 135 degrees, so that it is possible to form the nitride semiconductor crystal with the area of the N face being greater than that of the seed crystal substrate, while applying the etching action to the end of the nitride semiconductor crystal. In the case of this arrangement, since most of the crystal faces tending to appear around the end of the nitride semiconductor crystal have an angle of not greater than 135 degrees, if the angle of sidewall is greater than 135 degrees, the distance between the sidewall and the outer end of the nitride semiconductor crystal increases with the growth of the nitride semiconductor crystal. With the growth progress, the etching action weakens and the growth of the nitride semiconductor crystal of the outer end is significant, and cracking tends to occur due to the stress in the outer end. A similar result to that of the conventional method is only provided.

When this angle θ is not greater than 135 degrees, since the distance between the sidewall 12a and the outer end of the nitride semiconductor crystal 2 tends to be held constant to balance the growth and the etching to the outer end, the growth rate of the outer end is held at a low value, to suppress the occurrence of cracking. In particular, when the open angle θ of the sidewall 12a is not greater than 120 degrees, since the stable crystal faces of the nitride semiconductor having an angle smaller than this are lessened, the growth rate around the outer end is reduced to substantially zero, and an even higher growth yield can be achieved.

As described above, by applying the nitride semiconductor crystal producing method of the above-described embodiment to the growth of the nitride semiconductor crystal, in the thin film growth over a heterogeneous substrate, it is possible to grow the nitride semiconductor layer thicker than the conventional without cracking, and it is possible to enhance the yield more significantly than the conventional method. Further, by applying the nitride semiconductor crystal producing method of the above embodiments to the production of the nitride semiconductor freestanding substrate, it is possible to significantly reduce failure due to cracking of the nitride semiconductor crystal. In addition, because the residual strain is lessened, the nitride semiconductor epitaxial wafer and the nitride semiconductor freestanding substrate of the above embodiments are suitable for the production of light emitting diodes and laser diodes, and fabrication of high electron mobility transistors and hetero bipolar transistors.

In addition, the nitride semiconductor crystal may be grown by appropriately combining the configurations of each container, etc. of FIGS. 3A to 6 used in the above embodiments. For example, the bottom wall 12b of the container 12 shown in FIG. 5 may be provided with a feed pipe to feed the gas with the etching action as shown in FIG. 4, and a tray may be provided on the support shaft with the feed pipe inserted therearound, so that the seed crystal substrate 1 shown in FIG.

5 may be installed on this tray, and the nitride semiconductor crystal 2 expanded in the growth direction as shown in FIG. 5 may be grown.

EXAMPLES

The present invention will be described in more detail by way of the following examples (including modifications), but is not limited to these examples.

Example 1 and Comparative Example 1

Comparative Example 1

Figure 7:
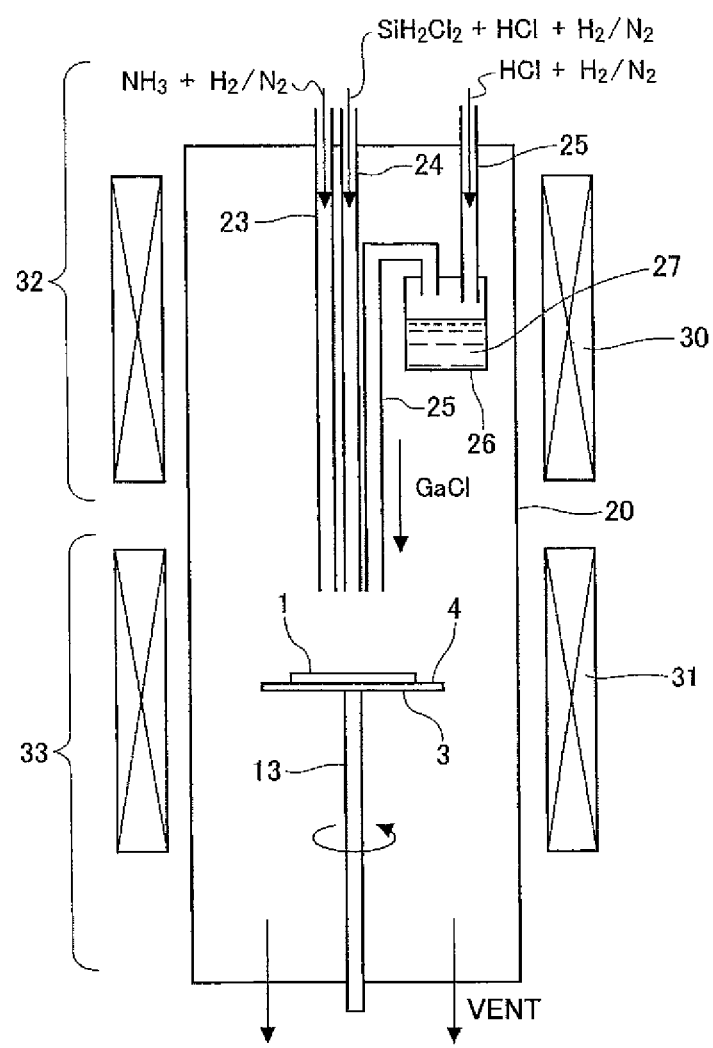
FIG. 7 is a schematic view of a conventional HVPE apparatus used in comparative example 1.

In comparative example 1, using a vertical arrangement HVPE apparatus configured similarly to the conventional shown in FIG. 7, over the seed crystal substrate 1 which is a sapphire substrate is grown a 2 to 20 µm GaN layer via a low-temperature grown GaN buffer layer. The HVPE apparatus is divided into an upper raw material section 32 and a lower growth section 33. An outer portion of the raw material section 32 of a reactor (growth furnace) 20 for performing crystal growth is provided with a raw material section peak 30 and an outer portion of the growth section 33 of the reactor 20 is provided with a growth section peak 31. By the raw material section peak 30, the raw material section 32 in the reactor 20 is heated to roughly 800 degrees Celsius and also by the growth section peak 31 the growth section 33 in the reactor 20 is heated to 500 to 1200 degrees Celsius.

For gas feed from the raw material section 32 toward the growth section 33, three system gas feed lines of a group V line (group V gas feed pipe) 23, a group III line (group DI gas feed pipe) 25, an etching/doping line (etching gas/doping gas feed pipe) 24 are installed. From the group V line 23, a $NH_3$ (ammonia gas) which is a nitrogen source, and a hydrogen gas, nitrogen gas, or a mixture of these gases as a carrier gas are fed. From the group III line 25, HCl and a hydrogen gas, nitrogen gas, or a mixture of these gases as a carrier gas are fed. A Ga melt tank 26 for storing metal gallium 27 is located in the middle of the group DI line 25, where the HCl gas and the metal gallium react to produce a GaCl gas, and the Gad gas is fed to the growth section 33. From the etching/doping line 24, when ungrown and during undoped GaN layer growth, a mixture of hydrogen and nitrogen gases is introduced, and during n-type GaN layer growth, dichlorosilane ($SiH_2Cl_2$, 100 ppm concentration due to hydrogen dilution) which is a Si source and a HCl gas and a hydrogen gas and a nitrogen gas are introduced. In addition, from the etching/doping line 24, during baking at a temperature of about 1100 degrees Celsius performed in order to remove GaN adhering in the reactor 20 after growth, a hydrogen chloride gas and hydrogen, nitrogen are introduced.

In the growth section 33 in the reactor 20, a tray 3 to rotate at a rotational speed of about 3 to 100 rpm is mounted horizontally, and a seed crystal substrate 1 is installed on the installation surface (placement surface) 4 of the tray 3 that faces the outlets of the gas feed lines 23 to 25. The tray 3 is provided on the rotating shaft (support shaft) 13 arranged vertically, and the tray 3 is rotated by the rotation of the rotary shaft 13. After being used for the growth of GaN on the seed crystal substrate 1, the raw material gas is vented to the outside from the most downstream of the reactor 20. Growth in the reactor 20 is all performed at atmospheric pressure (1 atm) in comparative example 1.

Each line pipe 23, 24, 25, the Ga melt tank 26, and the rotary shaft 13 of the tray 3 are made of a high purity quartz, and the tray 3 is made of a SiC coated carbon. As the sapphire substrate, there is used one having the face tilted at 0.3 degrees in the m axis direction from the c-face, and having a thickness of 900 µm, and a diameter of 100 mm.

The HVPE growth is performed as follows: After setting the sapphire substrate 1 on the tray 3, pure nitrogen is caused to flow to expel the air in the reactor 20. Next, in the gas in the mixture of 3 slm hydrogen gas and 7 slm nitrogen gas, the substrate temperature in the growth section 33 is held at 1100 degrees Celsius for 10 minutes. Then, at 550 degree Celsius substrate temperature, 20 nm low temperature grown GaN buffer layer is grown at a growth rate of 1200 nm/h. As gases caused to flow at this time, 1 sccm HCl, 2 slm hydrogen, and 1 slm nitrogen are fed from the group III line 25, 1 slm ammonia and 2 slm hydrogen are fed from the group V line 23, and 3 slm hydrogen is fed from the etching/doping line 24.

After the growth of the low temperature grown GaN buffer layer, the substrate temperature is increased to 1050 degrees Celsius, and a 2 to 20 mm undoped GaN layer is grown at a growth rate of 120 µm/h. As gases caused to flow at this time, 100 sccm HCl, 2 slm hydrogen, and 1 slm nitrogen are fed from the group III line 25, 2 slm ammonia and 1 slm hydrogen are fed from the group V line 23, and 3 slm hydrogen is fed from the etching/doping line 24.

After the growth, with 2 slm ammonia and 8 slm nitrogen being caused to flow, the substrate temperature is cooled to around room temperature. Thereafter, the purge nitrogen is performed for several tens of minutes, to produce a nitrogen atmosphere in the reactor 20, and the substrate is taken out.

A plurality of epitaxial wafers with different GaN layer thicknesses in the range of 2 to 20 µm are made as described above. For each GaN layer thickness epitaxial wafer, twenty wafers are made, and in FIGS. 8A, 8B and 8C, the yield, the average value of the full width at half maximum in (0002) diffraction and the average value of the full width at half maximum in (10-12) diffraction by X-ray diffraction (XRD) measurement of the GaN layer are indicated by a circle o. Here, the yield is calculated by deeming the wafer poor when even one crack with a length of 5 mm or more occurs in the GaN layer.

Figure 8A:
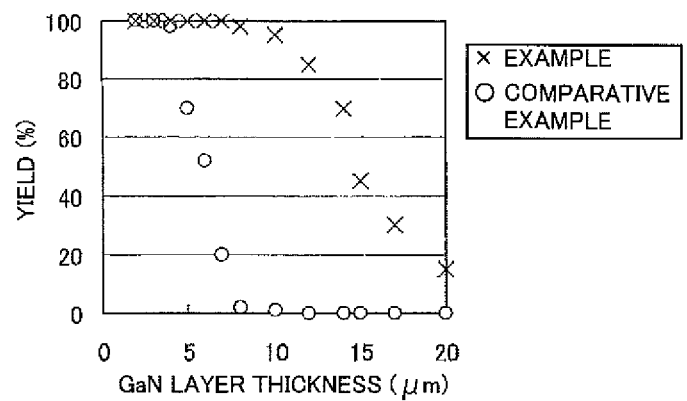
Figure 8B:
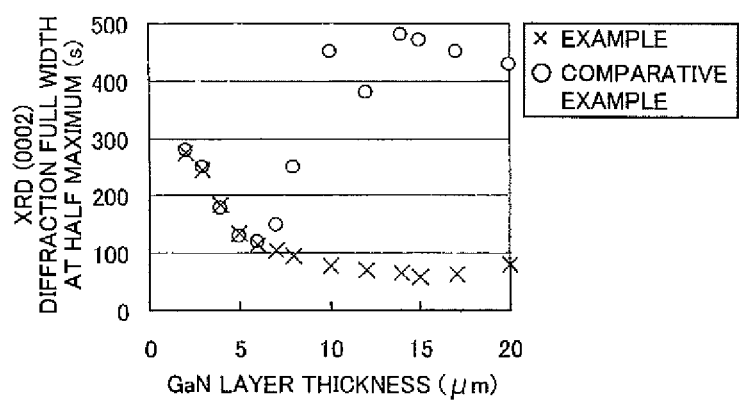
Figure 8C:
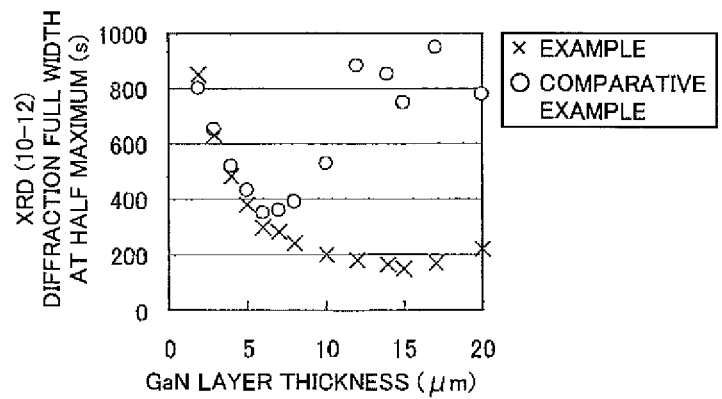

As shown in FIGS. 8A, 8B and 8C, until the thickness of the GaN layer is 4 µm, the yield is almost 100%, and the XRD full width at half maximum decreases with increasing thickness of the GaN layer. However, when the thickness of the GaN layer is 5 µm or more, cracking begins to occur, and the yield decreases (FIG. 8A). In addition, the occurrence of cracking causes degradation of the crystallinity of the GaN layer, and the XRD full width at half maximum increases (FIGS. 8B and 8C).

The cross-section of the GaN layer grown by the above conventional HVPE apparatus is observed by a fluorescence microscope (the light in the visible light region is observed by applying ultraviolet light). Regions with different colors of the GaN crystal are seen as shown in FIG. 9. At the bottom of FIG. 9, there are shown contour lines of the crystal regions in the image observed by the fluorescence microscopy at the top of FIG. 9. In addition, the image observed by the fluorescence microscope shown in FIG. 9 shows the observed image when growing the thick GaN crystal over the GaN freestanding substrate. The thickness of the GaN crystal 2b at the outer end grown over a face tilted from the c-face at a position of 300 µm from the principal surface (c-face) of the GaN crystal 2a is 44 µm, and the thickness of the GaN crystal 2b is not less than one-tenth the thickness of the GaN crystal 2a. Significant stress occurs in the outer end of the GaN crystal, and the occurrence of cracking is observed.

Figure 1:
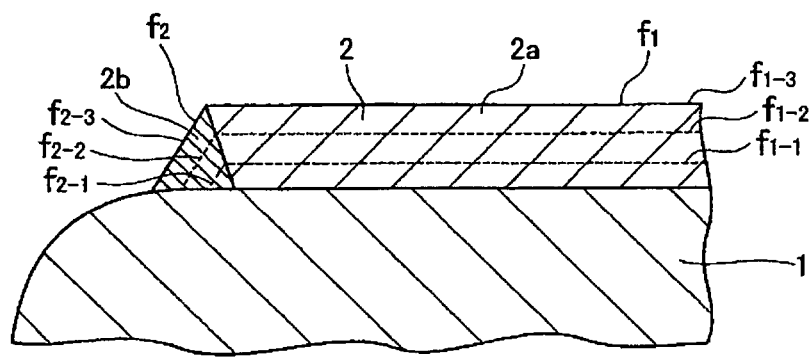
FIG. 1 is a schematic cross-sectional view showing a vicinity of an outer end of a nitride semiconductor layer grown over a heterogeneous seed crystal substrate by a conventional method.

No emission itself corresponding to the band gap of GaN can be observed by the fluorescence microscopy due to ultraviolet region, but the color differences are observed due to a change in concentration at a defect level resulting from a difference between impurity concentrations. That is, as described with reference to FIG. 1 and FIG. 2, the two different color regions in FIG. 9 reflect the difference between impurity concentrations. Due to each being grown over the separate crystal face, the difference between impurity concentrations results from a difference between impurity incorporation efficiencies.

Specifically, in the figure, the light gray part is the GaN crystal 2a grown on the c-face $f_1$, while the Oxford gray part is the region of the GaN crystal 2b grown on the face $f_2$ tilted from the c-face $f_1$. The impurity concentration in each of these regions is investigated by micro-Raman measurement. In the GaN crystal 2a grown on the c-face $f_1$, it is of n type and is about $0.5 \times 10^{18}/cm^3$ to $5 \times 10^{18}/cm^3$, while in the GaN crystal 2b grown on the face $f_2$ tilted from the c-face $f_1$, it is of the same n type but the impurity concentration is as very high as $1 \times 10^{19}/cm^3$ to $5 \times 10^{19}/cm^3$ which is two times or more that of the GaN crystal 2a. Although no doping gas is caused to flow during growth, it is considered that the impurity injected from the constituent member of the growth apparatus is incorporated into the crystal during the growth. As a result of SIMS measurement for each of these regions, it is found that the n-type conductivity of these is due to the incorporation of Si and oxygen. From this fact, it is assumed that, due to the very high impurity concentration of the crystal 2b grown over the face $f_2$ tilted from the c-face of the outer portion resulting from its higher impurity incorporation efficiency than that of the crystal 2a on the c-face $f_1$, stress occurs between the crystal 2b and the crystal 2a grown on the flat portion, and this increases film thickness, causes cracking, and leads to yield lowering.

Example 1

Figure 10:
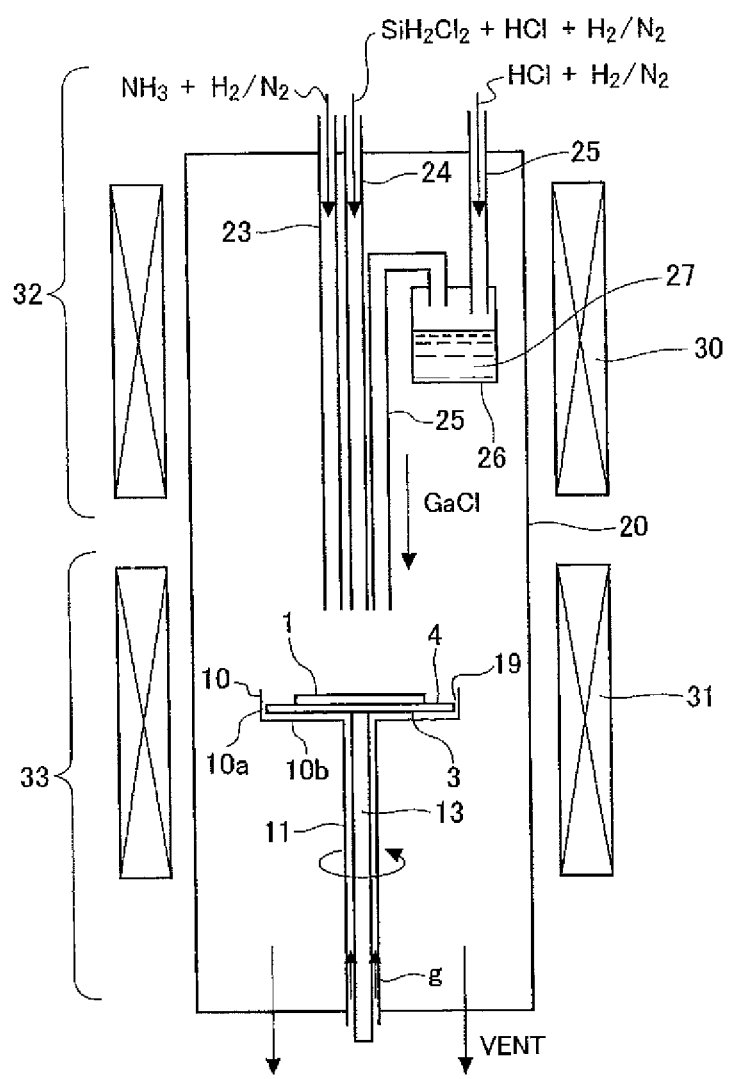
FIG. 10 is a schematic view of an HVPE apparatus for implementing the nitride semiconductor crystal producing methods according to the invention used in example 1.

In order to suppress the growth of the GaN crystal 2b with the high impurity concentration grown around the outer end of the GaN crystal in comparative example 1, a structure portion including the tray 3 and the rotary shaft (support shaft) 13 for supporting and rotating the seed crystal substrate 1 in the HVPE apparatus of FIG. 7 above is altered into the structure similar to FIG. 4, resulting in an HVPE apparatus of FIG. 10 for implementing the method of example 1. That is, the HVPE apparatus shown in FIG. 10 is structured to be able to introduce the purge gas g into the entire outer portion of the installation surface (placement surface) 4 of the seed crystal substrate 1. In the HVPE apparatus of FIG. 10, the rotary shaft 13 and the feed pipe 11 to feed the purge gas g are rotated integrally.

Above the annular gas injection hole 19 for the purge gas g formed between the outer surface of the tray 3 and the inner surface of sidewall 10a is provided the sidewall 10a up to a height of 3 mm from the installation surface 4. The installation surface 4 of the tray 3 and the side surface of the sidewall 10a are configured as an inner surface of the crucible shape or shallow cup-shaped container. The distance between the side surface of the sidewall 10a and the outer end face of the seed crystal substrate 1 is 5 mm.

Using the HVPE apparatus of this example 1, a GaN layer is grown over the sapphire seed crystal substrate 1 in the same conditions as comparative example 1 above. The flow rate of each line during low temperature grown GaN buffer layer and undoped GaN layer growth at 1050 degrees Celsius is the same as in the above-mentioned comparative example 1. However, the introduction of 3 slm nitrogen as the purge gas g around the seed crystal substrate 1 is different from in the above-mentioned comparative example 1.

When producing twenty wafers for each GaN layer thickness of epitaxial wafers having GaN layers of various thicknesses grown in this manner, in FIGS. 8A, 8B and 8C, the yield, the average value of the full width at half maximum in (0002) diffraction and the average value of the full width at half maximum in (10-12) diffraction by X-ray diffraction (XRD) measurement of the GaN layer are indicated by an x-mark x. In comparative example 1 using the HVPE apparatus of FIG. 7 to which the conventional method is applied, when the GaN layer thickness exceeds 5 μm the yield decreases rapidly, whereas in the GaN layer grown by the HVPE apparatus of FIG. 10 of example 1, until the GaN layer thickness is 8 μm, the yield is almost 100%. In example 1, when the thickness of the GaN layer exceeds 8 μm the yield decreases gradually, but the degree of the decrease is much more gradual than in comparative example 1, and the yield of 15% is still provided at a thickness of 20 μm. Further, in comparative example 1, at thicknesses of the GaN layer of 5 to 6 μm at which the yield decreases, the resulting minimum XRD full width at half maximum is 120 seconds in the (0002) diffraction, and is 350 seconds in the (10-12) diffraction. At thicknesses exceeding this, the XRD full width at half maximum increases. In contrast, in the GaN layer grown by the HVPE apparatus of example 1, until a thickness of 15 μm, the full width at half diffraction continues to decrease, and the resulting minimum full width at half maximum is 60 seconds in the (0002) diffraction, and is 150 seconds in the (10-12) diffraction.

That is, it is shown that, by using the HVPE apparatus shown in FIG. 10 of example 1, the GaN layer thicker than the conventional can be grown at the good yield, and the thick GaN layer grown in this manner has the improved crystallinity over the conventional.

In FIG. 12 there is schematically shown a result of fluorescence microscope observation of a cross-section of the GaN layer grown by the HVPE apparatus of example 1. Although as in the case of FIG. 9 of comparative example 1, some differences in color between the GaN crystal 2a on the c-face $f_1$ and the GaN crystal 2b on the face $f_2$ tilted from the c-face $f_1$ can be seen, even in that case the thickness of the GaN crystal 2b grown in the normal direction $d_2$ to the face $f_2$ tilted from the c-face is very thin, and even the maximum thickness thereof is less than one-tenth of the GaN crystal 2a grown in the normal direction $d_1$ to the c-face $f_1$. That is, as a result of the purge nitrogen of the perimeter of the seed crystal substrate 1, the growth raw material near the outer portion of the seed crystal substrate 1 is diluted, while the etching action of the hydrogen gas or the HCl gas is strengthened, so that the growth rate of the GaN crystal 2b on the face tilted from the c-face lying around the outer end of the GaN crystal 2 is less than one-tenth of the growth rate of the GaN crystal 2a on the c-face. As a result of the micro-Raman measurement of the GaN crystal 2 in example 1, the impurity concentration of each of the crystal 2a and the crystal 2b is similar to the impurity concentration in comparative example 1.

From the above results, it is considered that, using the HVPE apparatus of FIG. 10 of example 1 allows suppressing the growth of the GaN crystal 2b with the high impurity concentration on the face tilted from the c-face of the outer portion of the GaN crystal 2, thereby suppressing cracking. Also, as a result, since the thick GaN layer 2 can be grown while preventing cracking, the improvement of the crystallinity over the conventional is achieved.

Furthermore, it is found that using the method of example 1 allows making the curvature radius of the epitaxial wafer greater than comparative example 1, when growing the GaN layer over the sapphire heterogeneous substrate, and after the growth, cooling the epitaxial wafer down to room temperature.

When growing the GaN layer over the sapphire substrate, and when facing the GaN surface up, the epitaxial wafer is warped upward in a convex shape. For example, when growing the 8 μm GaN layer over the 2 inch diameter and 350 μm thick sapphire substrate by comparative example 1, its warpage (the difference in height between the center and the end of the surface of GaN) is about 120 μm, and the curvature radius of the wafer is then approximately 2.6 m. On the other hand, when using the method of example 1, when growing the 8 μm GaN layer over the same sapphire substrate, the warpage is as small as 50 μm, and the curvature radius is as great as 6 m.

Growing GaN layers of varying thicknesses over sapphire substrates of various thicknesses, comparing and examining them, let the thickness of the GaN layers be t (μm), it is then clear that the curvature radius R (m) of the GaN layers over the sapphire substrates can, using a coefficient A, be written as follows:

$$R=A/t \quad (1)$$

That is, the epitaxial wafer produced by the production method of the present invention satisfies the previously described formula (2), and has the large radius of curvature, and the small warpage. The epitaxial wafer with the large curvature radius and the small amount of warpage is advantageous in the case of forming a light emitting diode or a transistor structure on the above described GaN layer, and applying a photolithographic process to this. This is because in the photolithography process, if the epitaxial wafer is warped significantly, there are such adverse effects that the resolution of an element pattern transferred to the epitaxial wafer is degraded, and it is impossible to form a fine element, and also the yield in the photolithography process decreases.

Example 2

In example 2, in the method of example 1, the flow rate of the above described nitrogen gas which is the purge gas g to the outer portion of the sapphire seed crystal substrate 1 is variously altered within a range of from 2.0 slm to 10 slm, and an experiment similar to that of example 1 is performed.

When the purge nitrogen gas flow rate is 2 slm or greater, the results for the yield of the epitaxial wafer, the crystallinity of GaN, and the curvature radius of the epitaxial wafer are almost the same as the results in example 1. In addition, at the purge nitrogen gas flow rates of between 2 to 5 slm, the growth rate of the face tilted from the c-face is in the range of from less than one-tenth of the growth rate on the c-face to 0. For this reason, the occurrence of stress in the outer portion as in the conventional example is suppressed, and the occurrence of cracking is suppressed.

Also, at purge nitrogen flow rates of 6 slm or more, substantially the same results as in example 1 are provided. In this case, however, also, no growth over the face tilted from the c-face in the fluorescence microscopy observation of cross section is observed at all. In this case, it is determined that the size of the growth region on the sapphire substrate is smaller than in the case of 5 slm purge nitrogen gas flow rate, and that rather than growth, etching occurs in the end face of the GaN growth layer. The etching rate is in the range of from the growth rate equal to the growth rate on the c-face to one-tenth growth rate.

Even if this etching rate is even faster, there is no problem from the point of view of yield and crystallinity. However, because if the etching rate is too fast, the size of the finally resulting crystal becomes very small, it is considered desirable that the etching rate is practically not more than the growth rate on the intended growth face (c-face).

Here, consider the meaning that when increasing the purge nitrogen gas flow rate, the growth rate on the face tilted from the c-face is first reduced, and further the etching occurs. In the growth of GaN in this example, the growth atmosphere contains hydrogen. It is known that GaN is etched by hydrogen at high temperatures, and it is considered that the growth of GaN results from the growth rate exceeding the etching rate. That is, in the conditions of this example, the growth of GaN is performed in the environment of coexistence of etching and growth, and by purging the epitaxial wafer perimeter with nitrogen and diluting the raw material gas, the etching action in the perimeter of the GaN crystal is strengthened, and a decrease in the growth rate and the etching is observed.

Since the above etching acts only on the GaN crystal of the outer end of the epitaxial wafer, t is considered that in the range of the flow rate of the purge nitrogen gas in this example, the etching action weakens rapidly with increasing distance from the sidewall inner surface of the crucible shaped container.

Reference Example

If, in the producing method of Example 2 the flow rate of the purge nitrogen gas is 1 slm or less, the results for the yield of the epitaxial wafer, the crystallinity of GaN, and the radius of curvature of the epitaxial wafer are substantially the same as the results in Comparative Example 1.

This is considered because, due to little flow of the purge gas g, the growth rate in the normal direction to the face tilted from the c-face of the epitaxial wafer is ⅕ or more of the growth rate on the c-face, and the crystal portion with the high impurity concentration grown in the normal direction to the face tilted from the c-face is ¹/₁₀ or greater of the growth thickness of the crystal on the c-face, and therefore stress occurs in the outer portion as in the conventional example. Thus, it is found that the flow rate of the purge gas g may be more than 1 slm, preferably 2 slm or more.

Example 3

In example 3, an experiment similar to example 2 is performed by changing the purge gas to the epitaxial wafer perimeter to argon and helium, almost the same result as example 2 are provided. From this result, the advantageous effect of the present invention is considered to be provided by using an inert gas other than nitrogen, argon, and helium as the purge gas.

Example 4

In example 4, the same experiment as in example 2 is performed by using gases to etch GaN, such as hydrogen, chlorine, and hydrogen chloride as the purge gas to the epitaxial wafer perimeter. As a result, although the range of the purge gas flow rate is different from in example 2, by appropriately adjusting the purge gas flow rate so that the growth rate on the face tilted from the c-face is less than one-tenth of the growth rate on the c-face, a similar result to that of example 2 is provided.

In addition, the method of example 4 has the advantage of reducing the amount of hydrogen contained in the gas to be fed as a raw material gas more than in the case of examples 1 to 3. For this reason, the method of example 4 has the advantage of reducing the etching action in the intended growth face more than those of examples 1 to 3, therefore enhancing material efficiency.

Example 5

In example 5, on the tray 3 of the HVPE apparatus shown in FIG. 7, a 3 mm high cylindrical metallic ring is added and installed, and the inner surface of the ring and the installation surface 4 of the tray 3 are configured as the inner surface of the container in the shape of the crucible. As the material of the above ring, Ti (titanium) is used, and is nitrided in 2 slm ammonia and 8 slm hydrogen in the HVPE apparatus for 2 hours prior to growth, to change the surface of the ring into a titanium nitride and crystal growth is performed.

With the HVPE apparatus added with this ring, a similar experiment to that of comparative example 1 are performed. Advantageous effects of enhanced yield, improved crystallinity and increased curvature radius similar to those of example 1, are provided. Further, in this case, etching of the face tilted from the c-face occurs, and the etching rate is about one third of the growth rate on the c-face.

In example 5, there is no purge gas feed to the epitaxial wafer perimeter, but the same advantageous effect as that of the purge gas feed is provided. This is considered to be because the metal nitride of the ring that makes up the sidewall of the container is a catalyst, and hydrogen contained in the raw material gas is decomposed to produce atomic hydrogen with a strong etching action.

When the same sidewall is configured as for example a quartz or carbon ring, cracking is not suppressed. Further, even in the case of using a ring of metal nitride, when the total flow rate of hydrogen in the raw material gas is 1 slm or less, the growth rate on the face tilted from the c-face is faster, and cracking occurs. From the above results, it is shown that the presence of the metal nitride and some amount of hydrogen are necessary, and the idea of the development of the etching action due to the occurrence of the atomic hydrogen due to the catalyst action of the metal nitride is supported.

Further, in the case of changing the hydrogen flow rate in the raw material gas in the range of 2 to 7 slm, as in the case of changing the flow rate of the purge gas in example 2, the growth rate (etching rate) on the face tilted from the c-face is changed, but the growth rate is less than one-tenth of the growth rate on the c-face, while the etching rate is not more than the growth rate on the c-face, and in this range, advantageous effects of enhanced yield, and improved crystallinity similar to those of example 1, are observed.

Example 6

In example 6, an experiment similar to example 5 is performed by changing the metal material of the ring constituting the container sidewall into any of Zr, Nb, Ta, Cr, W, Mo, and Ni. As a result, similar results to those of example 5 are provided.

Example 7

In example 7, the same experiment as in examples 1 to 6 is performed by introducing dichlorosilane ($SiH_2Cl_2$) from the etching/doping line 24 during a growth of 2 to 3 μm at a top of the GaN layer, to grow an n-GaN layer with an impurity concentration of $0.5 \times 10^{18}/cm^3$ to $5 \times 10^{18}/cm^3$. The growth uses both a background impurity concentration (impurity concentration in undoping) varying depending on growth conditions, and dichlorosilane doping. Also in this case, similar results to those of examples 1 to 6 are provided.

Example 8

In example 8, a similar experiment to in examples 1 to 7 is performed by various changing the growth temperature, gas flow rate, growth rate, and growth pressure. Although the resulting yield and the XRD full width at half maximum is slightly different from those of the examples above, when the growth rate of the face tilted from the c-face of the outer portion of the GaN crystal is less than one-tenth of the growth rate of the c-face, advantageous effects of enhanced yield, and improved crystallinity similar to those of examples 1 to 7, are provided.

In addition, throughout the experiments to date, the angle between the Ga-polar c-face of the GaN growth layer and the face tilted from the c-face occurring around the outer portion tends to be 90 degrees in the end facing in the m axis direction of the GaN crystal and formed with the m-face, and around the end other than it, as shown in FIG. 12, a face tilted at an angle between the c-face and the face tilted from the c-face of 110 degrees to 135 degrees occurs.

Example 9

In example 9, an experiment similar to those of examples 1 to 8 is performed by changing the distance between the GaN crystal and the sidewall in the range of 0.5 to 20 mm. When the above distance is smaller than 1 mm, during the growth, the GaN crystal of the end face of the epitaxial wafer may come into contact with the container sidewall. In this case, due to the GaN crystal of the epitaxial wafer end face and the sidewall being fixed, stress occurs during growth, and cracking tends to occur. Further, when the above distance is greater than 10 mm, the local application of the etching action to only the end of the epitaxial wafer is difficult, and when such conditions as not to cause cracking are selected, a significant reduction of the region to grow the GaN layer is seen.

From the above, it is deemed appropriate that the distance between the GaN crystal and the sidewall is from 1 to 10 mm.

From the examples described above, it is concluded that in order to grow the GaN layer which is good in the yield, thick and high in the crystallinity (narrow in the XRD full width at half maximum), it is important to install the seed crystal substrate in the crucible shaped container having the sidewall, and maintain the distance between the sidewall with the etching action weakening with distance and the perimeter of the GaN crystal in the range of 1 to 10 mm, i.e., to grow the GaN crystal with the shape substantially similar to the shape of the inner surface of the crucible shaped container, in no contact with the portion of the inner surface of the container, which is not contacted with GaN at growth initiation, throughout the entire growth period. In addition, as a feature of the GaN layer realized by the above-described examples, it is particularly notable that the growth thickness of the crystal portion with the high impurity concentration lying in the outer portion of the crystal on the deliberately grown face (in the examples mainly the Ga-polar c-face) is not more than one-tenth of the growth thickness of the crystal on the deliberately grown face. Also, it is an important advantage in device application that the GaN epitaxial wafer in the above-described embodiments has the radius of curvature larger than that of the conventional method.

Example 10 and Comparative Example 2

In example 10 and comparative example 2, a GaN freestanding substrate is produced by the void-assisted separation (VAS) method described in JP-A-2004-039810 described above.

Comparative Example 2

In FIG. 13, there is shown a schematic of the VAS method. A void substrate 40 is first prepared as a seed crystal substrate (FIG. 13A). The void substrate 40 results from a metal organic vapor phase epitaxy (MOVPE) method or the like growing an about 300 nm thick GaN thin film over a sapphire substrate 41, depositing a Ti film over its surface, and then heat treating it in hydrogen and ammonia. The void substrate 40 results from the above-described heat treatment converting the Ti film into a mesh structure TiN layer 43, and forming a multiplicity of voids 44 in the GaN thin film to produce a void containing GaN layer 43.

Then, over the void substrate 40, a thick GaN layer 45 is grown by the HVPE method (FIG. 13B), and then the sapphire substrate 41 is separated from the void portion. This results in a GaN crystal (GaN single crystal) 46, which is a GaN freestanding substrate (FIG. 13C).

As the sapphire substrate 41, there is used one having a surface tilted in the range of 0.05 to 2 degrees in the a-axis or m-axis direction from the c-face or in a direction therebetween, and having a thickness of 300 to 1500 μm, and a diameter of 35 to 200 mm. The thickness of Ti during the above-mentioned void substrate production is 5 to 100 nm.

Over the void substrate 40, the GaN single crystal having a diameter of 35 to 200 mm and a thickness of 50 μm to 10 mm is produced. The HVPE growth conditions are as follows: For example, the substrate temperature is 800 to 1200 degrees Celsius, the pressure is 10 kPa to 120 kPa, and the growth rate is 30 to 1000 μm/h. As the growth apparatus, there is used the HVPE apparatus shown in FIG. 7. The flow rates of each line are set in the following ranges. From the group III line 25, 25 to 1000 ccm of HCl and 2 slm of hydrogen are added, and the flow rate of nitrogen is set such that the total flow rate of the group III line 25 is 3 slm. From the group V line 23, 1 to 2 slm of ammonia and 1 slm hydrogen are added, and the flow rate of nitrogen is set such that the total flow rate of the group V line 23 is 3 slm. In addition, from the etching/doping line 24, 3 slm hydrogen is caused to flow.

The dislocation density of the GaN single crystal formed over the void substrate is determined by the thickness of the Ti film during void substrate fabrication. As the Ti film is thinner, the dislocation in the void containing GaN layer 43 MOVPE grown of the void substrate tends to propagate to the thick GaN layer 45 formed over the Ti film, and therefore the dislocation density is high. The dislocation density of the GaN single crystal to provide the Ti film thickness in the range of 5 to 100 nm is in the range of $1\times10^4/cm^2$ to $1\times10^8/cm^2$.

Further, any surfaces of the resulting GaN crystals are mirror surfaces having few pits after growth. The electron density in the GaN crystal is set in the range of $1\times10^{15}/cm^3$ to $5\times10^{18}/cm^3$, by adjusting the flow rate of dichlorosilane to be added during undoped growth or growth.

Figure 14:
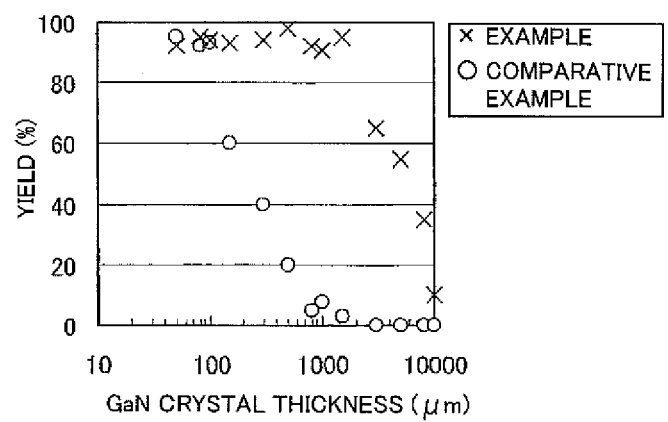
FIG. 14 is a graph showing a relationship between thickness and yield of a GaN crystal grown over a heterogeneous substrate in example 10 according to the invention and comparative example 2.

When growing GaN crystals (GaN layers) having a thickness of 50 μm to 10 mm by the combination of these various conditions, the dependence of the yield (defined as the ratio of being not poor when growing 20 wafers in the same conditions, and as poor when a crack with a length of 5 mm or more occurs) on the growth thickness is indicated by a circle o in FIG. 14. The yield is almost not dependent on the carrier concentration and the dislocation density, but is strongly dependent on only the thickness of the GaN crystal. When the thickness of the GaN crystal is not more than 100 μm, the resulting yield is nearly 100%, but when the thickness of the GaN crystal exceeds 100 μm, the yield decreases rapidly, and the yield of the GaN freestanding substrate (the GaN crystal) having a thickness exceeding 800 μm is less than 10%.

The cross sections of these GaN freestanding substrates (GaN crystals) are observed by a fluorescence microscopy. As shown in FIG. 9, different color regions similar to those of comparative example 1 are observed around the end of the GaN freestanding substrates, and the growth rate in a direction perpendicular to the side surface is not less than 1/10 of the growth rate perpendicular to the principal surface. These GaN crystals in each portion are examined by the micro Raman method. The GaN crystal grown on the tilted face of the end of the freestanding substrates (GaN crystals), and the GaN crystal grown on the Ga polar c-face are different in impurity concentration: In the GaN crystal on the c-face, the impurity concentration is of n-type and is about $0.5\times10^{18}/cm^3$ to $5\times10^{18}/cm^3$, while in the GaN crystal grown on the face tilted from the c-face, the impurity concentration is of the same n-type, but is as very high as $1\times10^{19}/cm^3$ to $5\times10^{19}/cm^3$ which is two times or more the impurity concentration in the GaN crystal on the c-face.

Example 10

On the other hand, in example 10, in the same manner as in example 5, there is used the HVPE apparatus in which the ring of metal nitride serving as the catalyst is installed on the tray 3 in FIG. 7, or the HVPE apparatus shown in FIG. 10. In the same manner as examples 1 to 9, with the method of the present invention to introduce the diluting gas, etching gas or hydrogen gas around the perimeter of the void substrate 40 which is the seed crystal substrate, and in the same manner as in examples 1 to 9, when the growth rate of the GaN crystal of the face tilted from the c-face is set at less than one-tenth of the growth rate of the GaN crystal on the c-face, the yield is enhanced dramatically as indicated by an x-mark x in FIG. 14. Until the thickness of the GaN layer is 1500 μm, the resulting yield is almost 100%, and is maintained at 10% even in the thickest case of 10 mm.

However, the above results are limited to only the case the surface of the GaN layer 45 is located to be lower than the height of the container sidewall. When the growth surface of the GaN layer 45 is higher than the height of the sidewall, the yield drops sharply. This is because if the surface of the GaN layer 45 is higher than the sidewall, the etching action in the outer portion of the GaN crystal is weakened, growth around the outer portion occurs, and therefore stress occurs. Also, if the distance between the GaN crystal 45 and the sidewall is less than 1 mm, the sidewall and the GaN crystal are fixed, cracking occurs, and the yield worsens. When the distance between the GaN crystal 45 and the sidewall is wider than 10 mm, no decrease in the yield occurs, but it is difficult to localize the etching action in only the end face, and the growth region of the GaN crystal is greatly reduced.

Further, as described in example 8, the angle between the Ga-polar c-face of the GaN growth layer and the face tilted from the c-face occurring around the outer portion tends to be 90 degrees in the end facing in the M axis direction of the GaN crystal and formed with the m-face, and around the end other than it, as shown in FIG. 12, a face tilted at an angle between the c-face and the face tilted from the c-face of 110 degrees to 135 degrees tends to occur. However, by appropriately selecting the growth conditions, it is also possible to set this angle at 90 degrees around the entire perimeter.

From Example 10 and comparative example 2, it is concluded that in order to produce the GaN freestanding substrate with good yield and great thickness, it is important to install the seed crystal substrate in the crucible shaped container having the sidewall, and maintain the distance between the sidewall with the etching action weakening with distance and the perimeter of the substrate in the range of 1 to 10 mm, i.e., to grow the GaN crystal with the shape substantially similar to the shape of the inner surface of the crucible shaped container, in no contact with the portion of the inner surface of the container, which is not contacted with the seed crystal substrate at growth initiation, throughout the entire growth period. In addition, as a feature of the GaN freestanding substrate realized by this example, it is particularly notable that in the outer portion of the GaN freestanding substrate, the growth thickness of the crystal portion with the higher impurity concentration than that of the crystal on the c-face is not more than one-tenth of the growth thickness of the crystal on the c-face.

Example 11 and Comparative Example 3

In general, in GaN freestanding substrates realized on heterogeneous substrates by various methods including the VAS method, a growing GaN crystal has a significant reduction in the dislocation density of for example from $10^8/cm^2$ to $10^5/cm^2$ caused in the thickness direction. Because residual strain is introduced in the GaN crystal due to this reduction in the dislocation density, there in many cases remains strain in the GaN freestanding substrates grown over the heterogeneous substrates. Typically, in the case of the GaN freestanding substrates in which the c-face is the surface thereof, the c-face has a curvature radius of 2 to 4 m immediately after growth.

The presence of this strain leads to the yield lowering due to the occurrence of cracking when the GaN Growth thickness exceeds 1500 μm, even in the case of using the method of the present invention, as shown in FIGS. 8A to 8C of example 10.

Such residual strain can be greatly reduced by polishing and removing the back side of the GaN freestanding substrate produced by the VAS method or the like. For example, if after growth of the 1500 μm thick GaN freestanding substrate, its back side is removed by 1000 μm, the curvature radius of the c-face which is 2 to 4 m immediately after the growth increases to 10 m or more. If the back side polished GaN freestanding substrate is used as the seed crystal, since the residual stress becomes very small, it can be expected that it is possible to grow the GaN layer which is impossibly thick in the growth over the heterogeneous substrate.

Comparative Example 3

In comparative example 3, with the method of the present invention in Example 10, the back side (the N polar c-face) of the GaN freestanding substrate having a thickness of 1500 μm grown by the VAS method is polished by 1000 μm, and further the front side (the Ga polar c-face) is polished by 100 μm, resulting in the GaN freestanding substrate having a thickness of 400 μm with enhanced flatness being used as the seed crystal. And, over the Ga-polar front side of this GaN freestanding substrate is grown the GaN layer by HVPE.

As the GaN substrate which is the seed crystal, there is used one having a surface tilted in a range of 0.05 to 2 degrees in the a-axis or m-axis direction from the Ga-polar c-face or in a direction therebetween, and having a thickness of 400 mm, and a diameter of 35 to 200 mm. The typical dislocation density is $1\times10^6/cm^2$.

The GaN single crystals having a thickness of 50 μm to 100 mm are produced. The HVPE growth conditions are as follows: For example, the substrate temperature is 800 to 1200 degrees Celsius, the pressure is 10 kPa to 120 kPa, and the growth rate is 30 to 1000 μm/h. As the growth apparatus, there is used the HVPE apparatus shown in FIG. 7. The flow rates of each line are set in the following ranges. From the group III line 25, 25 to 1000 ccm of HCl and 2 slm of hydrogen are added, and the flow rate of nitrogen is set such that the total flow rate of the group III line 25 is 3 slm. From the group V line 23, 1 to 2 slm of ammonia and 1 slm hydrogen are added, and the flow rate of nitrogen is set such that the total flow rate of the group V line 23 is 3 slm. In addition, from the etching/doping line 24, 3 slm hydrogen is caused to flow.

Also, any surfaces of the GaN single crystals (seed crystals) used here are mirror surfaces having few pits after growth. For the electron density in the GaN crystals, the GaN crystals are prepared which have the electron density in the range of $1\times10^{15}/cm^3$ to $5\times10^{18}/cm^3$, by adjusting the flow rate of dichlorosilane to be added during undoped growth or growth.

Figure 15:
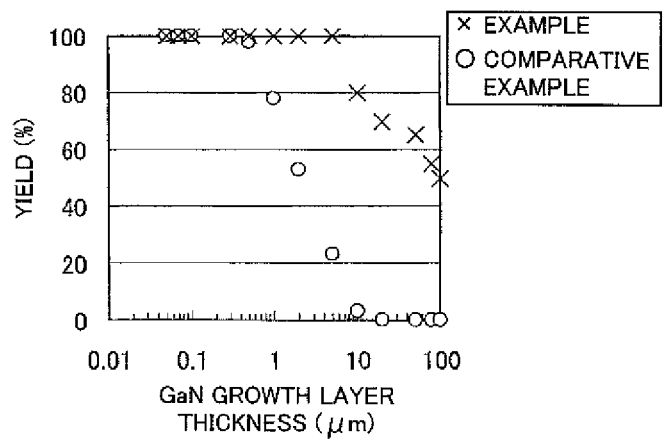
FIG. 15 is a graph showing a relationship between thickness and yield of a GaN growth layer grown over a GaN substrate in example 11 according to the invention and comparative example 3.

When growing GaN crystals (GaN layers) having a thickness of 50 μm to 100 mm by the combination of these various conditions, the dependence of the yield (defined as poor when a crack with a length of 5 mm or more occurs) on the growth thickness is indicated by a circle o in FIG. 15. Even in this case, the yield is almost not dependent on the carrier concentration and the dislocation density, but is strongly dependent on only the thickness of the GaN crystal. When the thickness of the GaN crystal newly grown over the GaN crystal (seed crystal substrate) by the VAS method is not more than 500 μm, the resulting yield is nearly 100%, but when the thickness of the growth layer of the GaN crystal exceeds 1 mm, the yield decreases rapidly, and the yield of the GaN freestanding substrate (the GaN crystal) having a thickness exceeding 10 mm is less than 10%.

Figure 2:
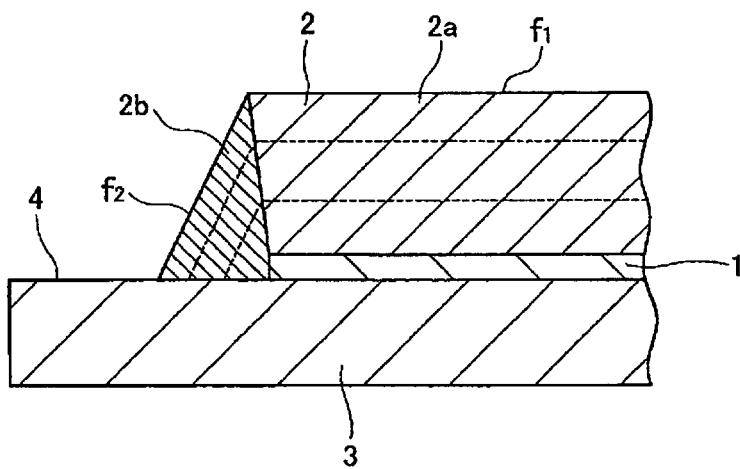
FIG. 2 is a schematic cross-sectional view showing a vicinity of an outer end of a nitride semiconductor layer grown over a nitride semiconductor freestanding seed crystal substrate by a conventional method.

The cross sections of these GaN freestanding substrates are observed by a fluorescence microscopy. As schematically shown in FIG. 2, different color regions similar to those of FIG. 9 are observed around the end of the GaN freestanding substrates, and the growth rates in a direction perpendicular to respective faces thereof are substantially the same. Each portion of these is examined by the micro Raman method. The crystal grown on the tilted face of the wafer end, and the crystal grown on the Ga polar c-face are different in impurity concentration: In the crystal on the c-face, the impurity concentration is of n-type and is about $0.5\times10^{18}/cm^3$ to $5\times10^{18}/cm^3$, while in the crystal grown on the face tilted from the c-face, the impurity concentration is of the same n-type, but is as very high as $1\times10^{19}/cm^3$ to $5\times10^{19}/cm^3$ which is two times or more the impurity concentration in the GaN crystal on the c-face.

Example 11

On the other hand, in example 11, in the same manner as in example 5, there is used the HVPE apparatus in which the ring of metal nitride serving as the catalyst is installed on the tray 3 in FIG. 7, or the HVPE apparatus shown in FIG. 10. In the same manner as examples 1 to 9, the GaN crystal is grown by the method of the present invention to introduce the diluting gas, etching gas or hydrogen gas around the perimeter of the GaN substrate which is the seed crystal substrate. In the same manner as in examples 1 to 9, when the growth rate of the GaN crystal of the face tilted from the c-face is set at less than one-tenth of the growth rate of the GaN crystal on the intended growth face, the yield is enhanced dramatically as indicated by an x-mark x in FIG. 15. Until the thickness of the GaN layer newly grown over the GaN crystal (seed crystal substrate) by the VAS method is 5 mm, the yield is maintained at almost 100%, and is still maintained at 50% even when the thickness of the grown layer of this GaN crystal is 100 mm.

Figure 16:
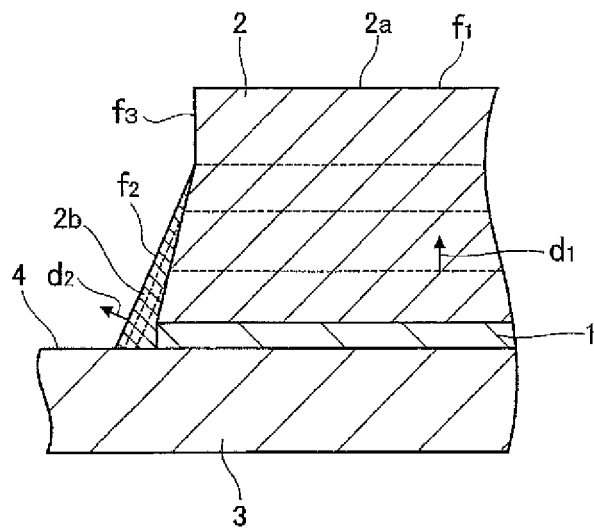
FIG. 16 is a schematic cross-sectional view illustrating a vicinity of an outer end of a GaN crystal grown over a GaN freestanding substrate as a seed crystal in example 11 according to the invention.

In FIG. 16, there is schematically shown a result of fluorescence microscope observation of a cross-section of the outer end of the GaN freestanding substrate grown as the seed crystal substrate using example 11. Although the crystal 2b of the high impurity concentration of the end face is present, its amount is small, and the growth rate of the crystal 2b is estimated to be, at maximum, less than one-tenth of the growth rate of the crystal 2a on the c-face. Further, when the growth thickness of the GaN crystal 2 is thin, since a crystal face $f_2$ is tilted from the c-face around the end with crystal growth, the area of the c-face $f_1$ is reduced gradually. However, the c-face $f_1$ does not continue to contract, and the GaN crystal 2 is grown to be thick (about 2 mm at maximum) to some extent. After the distance between the end face and the sidewall is a value, the growth progresses with the end face forming a perpendicular face $f_3$ at 90 degrees to the c-face and with the shape and area of the c-face being held constant. This is a phenomenon that results from the distance between the end face and the inner surface of the container sidewall being widened, the etching action from the sidewall being weakened, and the growth and the etching on the end face being balanced.

However, the above results are limited to only the case the surface of the GaN crystal 2a grown on the c-face is located to be lower than the height of the container sidewall. When the growth surface of the GaN crystal 2a is higher than the height of the sidewall, the yield drops sharply. This is because if the surface of the GaN crystal 2a is higher than the sidewall, the etching action in the outer portion of the GaN crystal 2a is weakened, crystal growth around the outer portion occurs, and therefore stress occurs. Also, if the distance between the GaN crystal 2a and the sidewall is less than 1 mm, the sidewall and the GaN crystal 2a are fixed, cracking occurs, and the yield worsens. When the distance between the GaN crystal 2a and the sidewall is wider than 10 mm, no decrease in the yield occurs, but it is difficult to localize the etching action in only the end face, and the growth region of the GaN crystal is greatly reduced.

From Example 11 and Comparative Example 3, it is concluded that in order to produce the GaN freestanding substrate with good yield and great thickness, even in the case of using the nitride semiconductor freestanding substrate as the seed crystal, it is important to install the seed crystal substrate in the crucible shaped container having the sidewall, and maintain the distance between the sidewall with the etching action weakening with distance and the perimeter of the GaN crystal in the range of 1 to 10 mm, i.e., to grow the GaN crystal with the shape substantially similar to the shape of the inner surface of the crucible shaped container, in no contact with the portion of the inner surface of the container, which is not contacted with the seed crystal substrate at growth initiation, throughout the entire growth period. In addition, as a feature of the GaN freestanding substrate realized by this example, it is particularly notable that in the outer portion of the GaN freestanding substrate, the growth thickness of the crystal portion with the higher impurity concentration than that of the crystal on the c-face is not more than one-tenth of the growth thickness of the crystal on the c-face.

Example 12

In example 11, when the GaN growth thickness exceeds 5 mm, the yield is decreased due to slight strain remaining in the GaN freestanding substrate used as the seed crystal substrate. Therefore, in example 12, further enhancement of the yield is attempted by applying the etching action not only to the outer end face of the GaN crystal, but also to the back side of the GaN freestanding substrate with residual strain used as the seed crystal substrate during growth.

For a method used in example 12, in a manner similar to example 11, a block (block 17 as shown in FIG. 6 of the above-described embodiment) having a height of 1 to 2 mm and made of quartz, carbon, or metal nitride is installed on the back side of the seed crystal substrate, and the seed crystal substrate is floated from the installation surface (for example, the bottom surface of the container), to also apply the etching action to the back side of the seed crystal substrate. For example, there is used the method by also providing an outlet for the purge gas at the center of the installation surface, and introducing therefrom an etching gas such as hydrogen, chlorine, hydrogen chloride or the like, or the method by forming the installation surface from the metal nitride, and adding hydrogen to the raw material gas.

Although the etching rate of the back side of the seed crystal substrate by these methods changes due to temperature, growth atmosphere, growth pressure, purge gas flow rate, etc., the higher yield than that of example 11 can be provided when the etching rate is not less than one-hundredth of the growth rate on the Ga-polar c-face. When the etching rate of the back side is increased, the yield is increased, but when the etching rate of the back side is not less than one-twentieth of the growth rate on the Ga-polar c-face, the yield is constant.

Figure 17:
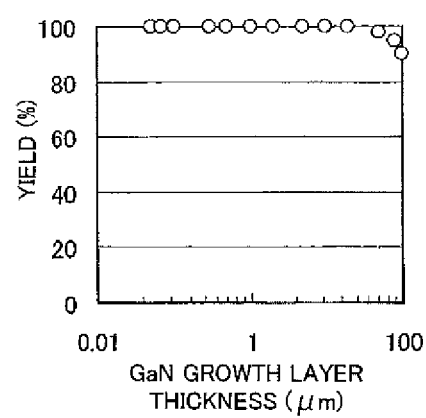
FIG. 17 is a graph showing a relationship between thickness and yield of a GaN growth layer grown over a GaN substrate in example 12 according to the invention.

In FIG. 17, there is shown the relationship between the yield and the thickness of the GaN growth layer when the etching rate of the back side is one-twentieth of the growth rate on the Ga-polar c-face. The yield as high as 90% is still maintained even when the thickness of the GaN growth layer is 100 mm.

Example 13

In example 13, an experiment similar to those of examples 11 and 12 is performed by using not the Ga polar c-face, but the N polar c-face as the growth face, to grow GaN, to produce the GaN freestanding substrate.

In this case, by the use of the conventional HVPE apparatus, the end face of the GaN crystal has an opposite inclination to that of FIG. 16, and the c-face is expanded with growth. For this reason, the growth of the GaN freestanding substrate by the N polar face growth is the very effective method in order to realize the larger-diameter GaN substrate.

However, in the case of using the conventional HVPE apparatus, as well as in the Ga polar face growth, in the N polar face growth, stress is caused by the crystal growth in the end face, and it is difficult to provide the high yield.

However, by using the method of the present invention, it is confirmed that even in the N polar face growth, it is possible to fabricate the GaN freestanding substrate with high yield as in examples 11 and 12. Furthermore, in this case, by the expansion tendency of the N polar face and the etching action being balanced, it is possible to produce the cylindrical freestanding substrate with the GaN crystal grown to be constant in the area of its N polar face similar to the cylindrical container, shape. This freestanding substrate is industrially very useful in that wafers having a constant diameter can be produced efficiently by slicing this freestanding substrate.

Also, in particular, in the N polar face growth, for example, as in the above embodiment shown in FIG. 5, by setting the angle θ between the side surface of the sidewall 12a of the container 12 and the placement surface 15 of the bottom wall 12b of the container 12 to place the seed crystal substrate 1 in the range of greater than 90 degrees and not greater than 135 degrees, and making the side surface of the sidewall 12a open toward the opening, it is possible to expand the area of the N polar face more than the seed crystal substrate 1, while applying the etching action to the end of the GaN crystal 2.

If the angle θ between the side surface of the container 12 and the placement surface 15 of the container 12 is greater than 135 degrees, since the crystal face which tends to appear at the end of the GaN crystal has an angle of not greater than 135 degrees, the distance between the side surface of the container 12 and the outer end of the GaN crystal 2 is increased with the growth of the GaN layer, and GaN growth occurs at the outer end of the GaN crystal 2, and cracking tends to occur due to this GaN growth. Only a same result as that of the conventional method can be provided.

When this angle θ is not greater than 135 degrees, since the distance between the side surface of the container 12 and the outer end of the GaN crystal 2 tends to be held constant to balance the growth and the etching to the end of the GaN crystal 2, the growth rate of the outer end of the GaN crystal 2 is held at substantially zero, to suppress the occurrence of cracking. In particular, when the angle θ is not greater than 120 degrees, since the stable GaN crystal faces having an angle smaller than this are lessened, a higher growth yield can be achieved and substantially the same result as the results of the above examples shown in FIGS. 14 and 17 is provided.

Next, modifications of the present invention are described below.

(Modification 1)

In modification 1, an experiment similar to examples 1 to 9 is performed by setting the diameter of the sapphire substrate at 50 to 200 mm, and taking the surface (principal surface) of the sapphire substrate as a face tilted in a range of 0.1 to 2 degrees in the a-axis or m-axis direction or a direction therebetween from the Ga-polar c-face, or an a-face, m-face, r-face or other semi-polar faces, or slightly tilted faces thereof, etc. A substantially same result as those of examples 1 to 9 is provided.

(Modification 2)

In modification 2, a similar experiment to modification 1 is performed by changing the sapphire substrate to a SiC substrate, and a Si substrate. A similar advantageous effect to that of modification 1 is confirmed.

(Modification 3)

In modification 3, the same experiment as in examples 1 to 9 is performed by changing the buffer layer from the low temperature grown GaN buffer layer to a low-temperature grown AlN buffer layer and a high temperature grown AlN buffer layer. Each buffer layer thickness is between 10 nm to 2 μm. In any case, a result similar to those of examples 1 to 9 is provided.

(Modification 4)

In modification 4, an experiment similar to that of examples 1 to 9 is performed by using the seed crystal substrates with irregularities in an upper surface thereof. For the shape of the irregularities, the height of the protrusions is 0.1 to 2 μm, the pitch is 1 to 10 μm, and there are used a bowl shape, conical shape, polygonal pyramid shapes of triangular pyramid shape to hexagonal pyramid shape, and these shapes having a flat portion on top thereof. Also, for the arrangement of the protrusions, the protrusions are arranged in a triangular or square grid, and the arrangement is used such that a side of the grid is in the a-axis or the m-axis direction. Forming a light-emitting element by using an underlying nitride semiconductor layer using those seed crystal substrates with the irregularities allows for enhancing light extraction efficiency more than the light-emitting element when used over the flat seed crystal substrate.

In any case of modification 4, when applying the nitride semiconductor crystal producing method of the present invention, a same advantageous effect as those of examples 1 to 9 is provided.

(Modification 5)

In modification 5, an experiment similar to examples 10 to 13 is performed by setting an a-face, m-face, r-face or other semi-polar faces, or slightly tilted faces thereof, etc. A substantially same result as those of examples 10 to 13 is provided.

(Modification 6)

For the principle of the nitride semiconductor crystal producing method of the present invention, the growth method is not limited to the HVPE method, but may also be applied to the case of changing the growth method to the MOVPE method, the ammonothermal synthesis method, or the Na flux method.

(Modification 7)

The nitride semiconductor crystal producing method of the present invention may also be applied to nitride semiconductor materials other than GaN, such as AlN, InN, and BN, and a mixed crystal of these materials including GaN.

(Modification 8)

The principle of the nitride semiconductor crystal producing method of the present invention may be also applied to semiconductors other than the nitride semiconductors or to crystalline materials other than the semiconductors.

(Modification 9)

Figure 18:
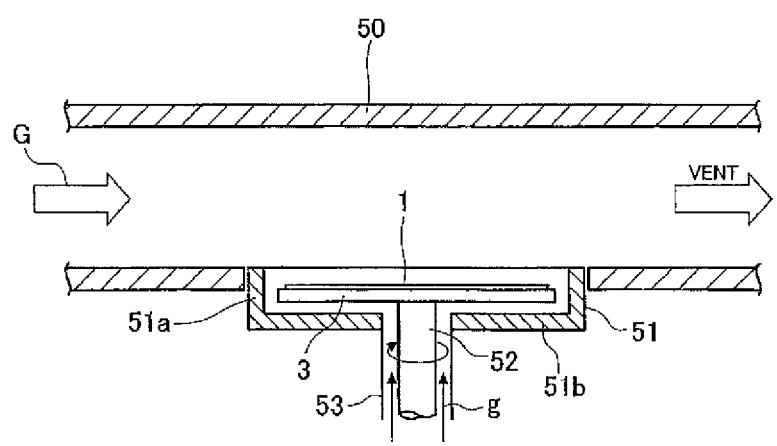
FIG. 18 is a cross-sectional view showing a horizontal flow type growing apparatus in modification 9 according to the invention.

The method of the present invention may be applied not only to the vertical arrangement crystal growing apparatuses (HVPE apparatus, MOVPE apparatus) as shown in FIG. 7 or FIG. 10, but also to a horizontal flow arrangement MOVPE apparatus, or HVPE apparatus shown in FIG. 18. That is, as shown in FIG. 18, a rectangular tube reactor (growth furnace) 50 is horizontally arranged, and an opening of a bottom wall of the reactor 50 is provided with a container 51 having a sidewall 51a, and in the container 51 the tray 3 is installed at a distance from the bottom wall 51b of the container 51. The bottom wall 51b is connected with a feed pipe 53 to feed a gas g having the etching action, and a rotary shaft 52 is provided to be passed through the feed pipe 53. The tray 3 is rotatably supported on the rotary shaft 52, and an outer portion of the reactor 50 is provided with a peak (not shown). A raw material gas G flows horizontally from one end to the other end in the reactor 50, to grow a crystal over the seed crystal substrate 1 installed on the tray 3. On the other hand, a gas g fed into the container 51 from the feed pipe 52 flows radially along the tray 3 between the tray 3 and the bottom wall 10b, and flows out from a gap between the outer surface of the tray 3 and the inner surface of the sidewall 10a.

Also, the method of the present invention may also be applied to, for example, a center-outlet self-revolution multi-charge crystal growth apparatus, i.e., a crystal growth apparatus in which a plurality of seed crystal substrates are disposed along the same circumference on a susceptor, and the plural seed crystal substrates on the susceptor are self-revolved, to cause the raw material gas to flow from the center of the susceptor, along the susceptor, radially, to each seed crystal substrate.

Further, by devising a way of holding the seed crystal substrate, the method of the present invention may also be applied not only to the face-up crystal growth apparatus in which the growth face faces up as in FIG. 7, FIG. 10, or FIG. 18, but also to a face-down crystal growth apparatus in which the growth face faces down, or a crystal growth apparatus in which the growth face faces in a vertical direction or an obliquely tilted direction. However, when etching the back side of the seed crystal substrate, it is necessary to reduce the etched amount of the back side to a certain amount, because if the seed crystal substrate is all etched, the crystal shifts or falls off the position at the initiation of growth.

Although the invention has been described with respect to the specific embodiments and modifications thereof, the appended claims are not to be thus limited to the specific embodiments and the modifications. It should be noted that all of the combinations of features described in the specific embodiments and the modifications are not necessarily essential for the means for solving the problems of the Invention.

What is claimed is:

1. A nitride semiconductor epitaxial wafer, comprising:
a plate-like seed crystal substrate; and
a nitride semiconductor crystal grown over the seed crystal substrate,
wherein the nitride semiconductor crystal includes a nitride semiconductor crystal grown in a principal surface direction of the seed crystal substrate, but around an outer end of the nitride semiconductor crystal grown in the principal surface direction, there is included no nitride semiconductor crystal grown in a face direction tilted from the principal surface, and having a higher impurity concentration than the nitride semiconductor crystal grown in the principal surface direction, or
even when there is included the nitride semiconductor crystal having the higher impurity concentration around the outer end, a growth thickness of the nitride semiconductor crystal having the higher impurity concentration around the outer end is less than one tenth of a growth thickness of the nitride semiconductor crystal grown in the principal surface direction.

2. The nitride semiconductor epitaxial wafer according to claim 1, wherein
the seed crystal substrate is a sapphire substrate, and the nitride semiconductor crystal is a GaN layer, and
let a curvature radius of the nitride semiconductor epitaxial wafer be R (m), a thickness of the GaN layer be t (µm), a thickness of the sapphire substrate be Y (µm), and a coefficient be A, then the following relations (1) and (2) are satisfied.

$$R = A/t \quad (1)$$

$$A > 0.00249 \times Y^{1.58483} \quad (2)$$

3. A plate-like nitride semiconductor freestanding substrate, comprising
a nitride semiconductor crystal grown in a principal surface direction of the nitride semiconductor freestanding substrate,
wherein around an outer end of the nitride semiconductor freestanding substrate, there is included no nitride semiconductor crystal having a higher impurity concentration than the nitride semiconductor crystal grown in the principal surface direction, or
even when there is included the nitride semiconductor crystal having the higher impurity concentration around the outer end, a growth thickness of the nitride semiconductor crystal having the higher impurity concentration around the outer end is less than one tenth of a growth thickness of the nitride semiconductor crystal grown in the principal surface direction.

* * * * *